US009852795B2

(12) United States Patent
Kang et al.

(10) Patent No.: US 9,852,795 B2
(45) Date of Patent: Dec. 26, 2017

(54) METHODS OF OPERATING NONVOLATILE MEMORY DEVICES, AND MEMORY SYSTEMS INCLUDING NONVOLATILE MEMORY DEVICES

(71) Applicant: SAMSUNG ELECTRONICS CO., LTD., Suwon-si, Gyeonggi-Do (KR)

(72) Inventors: Dong-Ku Kang, Seongnam-si (KR); Sang-Yong Yoon, Seoul (KR); Joon-Suc Jang, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/272,776

(22) Filed: Sep. 22, 2016

(65) Prior Publication Data

US 2017/0092361 A1    Mar. 30, 2017

(30) Foreign Application Priority Data

Sep. 24, 2015  (KR) .................. 10-2015-0135232
Dec. 3, 2015   (KR) .................. 10-2015-0171490

(51) Int. Cl.
*G11C 16/08*    (2006.01)
*G11C 16/04*    (2006.01)
(Continued)

(52) U.S. Cl.
CPC ........ *G11C 16/0466* (2013.01); *G11C 7/1063* (2013.01); *G11C 16/0483* (2013.01); *G11C 16/08* (2013.01); *G11C 16/24* (2013.01); *G11C 16/26* (2013.01); *G11C 16/3418* (2013.01); *G11C 16/3431* (2013.01); *G11C 29/832* (2013.01); *H01L 27/1157* (2013.01); *H01L 27/11565* (2013.01); *H01L 27/11582* (2013.01); *G11C 2029/4402* (2013.01)

(58) Field of Classification Search
CPC ............................ G11C 16/0466; G11C 16/08
USPC ..................................................... 365/185.11
See application file for complete search history.

(56) References Cited

U.S. PATENT DOCUMENTS 6,028,788 A  *  2/2000  Choi ................. G11C 16/0483
                                                 365/185.11
6,330,688 B1 *  12/2001  Brown ................... G11C 29/82
                                                      365/200

(Continued)

FOREIGN PATENT DOCUMENTS

JP    2009-146942    7/2009
JP    2010-267327   11/2010
(Continued)

*Primary Examiner* — Huan Hoang
*Assistant Examiner* — Muna A Techane
(74) *Attorney, Agent, or Firm* — F. Chau & Associates, LLC

(57) ABSTRACT

A method of operating a nonvolatile memory device includes performing a first memory operation on a first memory block of a plurality of memory blocks and a curing operation on a portion of the first memory block when a status signal indicates a ready state of the nonvolatile memory device during an interval equal to or greater than a reference interval after the first memory operation is completed. The nonvolatile memory device includes the plurality of memory blocks, each memory block including a plurality of vertical strings extending in a vertical direction with respect to a substrate.

19 Claims, 31 Drawing Sheets

(51) Int. Cl.
  *G11C 16/24* (2006.01)
  *G11C 16/26* (2006.01)
  *G11C 16/34* (2006.01)
  *H01L 27/11565* (2017.01)
  *H01L 27/1157* (2017.01)
  *H01L 27/11582* (2017.01)
  *G11C 29/00* (2006.01)
  *G11C 7/10* (2006.01)
  *G11C 29/44* (2006.01)

(56) References Cited

U.S. PATENT DOCUMENTS

| | | | |
|---|---|---|---|
| 7,483,324 B2 | 1/2009 | Blacquiere et al. | |
| 8,060,798 B2 | 11/2011 | Roohparvar et al. | |
| 8,724,397 B2 | 5/2014 | Asaoka et al. | |
| 8,839,071 B2 | 9/2014 | Jo | |
| 2002/0186590 A1* | 12/2002 | Lee | G11C 5/025 365/185.17 |
| 2005/0024956 A1* | 2/2005 | Tran | G11C 29/027 365/200 |
| 2008/0094914 A1 | 4/2008 | Park et al. | |
| 2009/0198879 A1 | 8/2009 | Tanaka | |
| 2010/0321998 A1* | 12/2010 | Jang | G11C 11/5628 365/185.03 |
| 2013/0055046 A1 | 2/2013 | Blodgett | |
| 2013/0205075 A1 | 8/2013 | Twitto et al. | |
| 2013/0279257 A1* | 10/2013 | Costa | G11C 5/02 365/185.17 |
| 2015/0348639 A1 | 12/2015 | Lee et al. | |

FOREIGN PATENT DOCUMENTS

| | | |
|---|---|---|
| KR | 10-0830580 | 4/2008 |
| KR | 1020130089472 | 8/2013 |
| KR | 10-1538071 | 7/2015 |

* cited by examiner

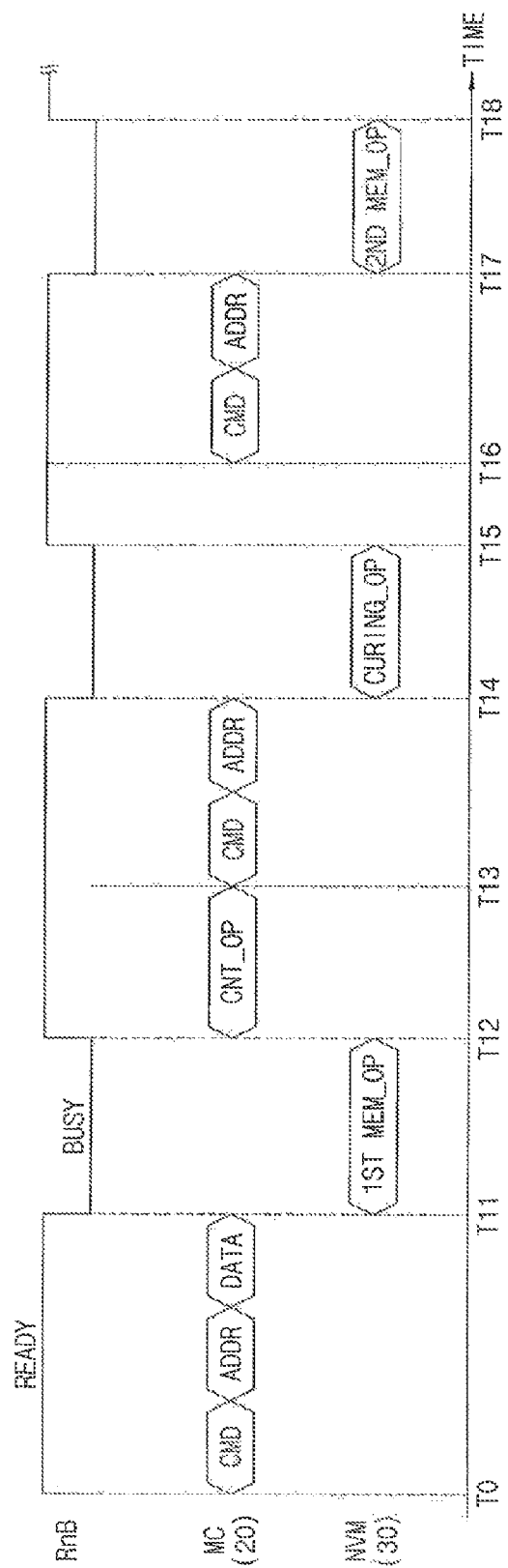

TURN OFF AT LEAST ONE STRING SELECTION TRANSISTOR OF A FIRST VERTICAL STRING —S210a

APPLY TURN-ON VOLTAGES TO WORDLINES CONNECTED TO CELL TRANSISTORS AND A GROUND SELECTION LINE CONNECTED TO A GROUND SELECTION TRANSISTOR OF THE FIRST VERTICAL STRING, RESPECTIVELY —S220a

MAINTAIN A VOLTAGE OF A COMMON SOURCE LINE CONNECTED TO THE GROUND SELECTION TRANSISTOR AT A GROUND VOLTAGE —S230a

METHODS OF OPERATING NONVOLATILE MEMORY DEVICES, AND MEMORY SYSTEMS INCLUDING NONVOLATILE MEMORY DEVICES

CROSS-REFERENCE TO RELATED APPLICATIONS

This U.S. Non-provisional patent application claims priority under 35 U.S.C. §119 to Korean Patent Application No. 10-2015-0135232, filed on Sep. 24, 2015 and Korean Patent Application No. 10-2015-0171490, filed on Dec. 3, 2015, in the Korean Intellectual Property Office (KIPO), the disclosures of which are incorporated by reference herein in their entireties.

1. TECHNICAL FIELD

Exemplary embodiments of the present inventive concept relate generally to semiconductor memory devices, and more particularly, to a method of operating nonvolatile memory devices, and memory systems including nonvolatile memory devices.

2. DISCUSSION OF THE RELATED ART

Semiconductor memory devices may be classified as volatile semiconductor memory devices or nonvolatile semiconductor memory devices. Volatile semiconductor memory devices may perform read and write operations at high speed, while contents stored therein may be lost in the absence of power. Nonvolatile semiconductor memory devices may retain contents stored therein in the absence of power. For this reason, nonvolatile semiconductor memory devices may be used to store contents in devices that tend to be powered off.

Nonvolatile semiconductor memory devices may include a mask read-only memory (MROM), a programmable ROM (PROM), an erasable programmable ROM (EPROM), an electrically erasable programmable ROM (EEPROM), etc.

A flash memory device is an example of a nonvolatile semiconductor memory device. A flash memory device may be used as the voice and image storing media of electronic apparatuses such as a computer, a cellular phone, a personal digital assistant (PDA), a digital camera, a camcorder, a voice recorder, an MP3 player, a handheld personal computer (PC), a game machine, a facsimile, a scanner, a printer, etc.

SUMMARY

According to an exemplary embodiment of the present inventive concept, in a method of operating a nonvolatile memory device, wherein the nonvolatile memory device comprises a plurality of memory blocks, each memory block including a plurality of vertical strings extending in a vertical direction with respect to a substrate, a first memory operation is performed on a first memory block of the memory blocks and a curing operation is performed on a portion of the first memory block when a status signal indicates a ready state of the nonvolatile memory device during an interval equal to or greater than a reference interval after the first memory operation is completed.

In an exemplary embodiment of the present inventive concept, each of the vertical strings may include at least one string selection transistor connected to a bit-line connected to a page buffer, at least one ground selection transistor connected to a common source line and a plurality of cell transistors connected in series between the at least one string selection transistor and the at least one ground selection transistor. A vertical channel may be formed by the plurality of cell transistors.

In performing the curing operation, at least one string selection transistor of a first vertical string of the vertical strings may be turned off, a turn-on voltage may be applied to each of a plurality of word-lines and a ground selection line (the first vertical string may include cell transistors connected to the word-lines and at least one ground selection transistor connected to the ground selection line), and a voltage of a common source line connected to the at least one ground selection transistor may be maintained at a ground voltage.

Each turn-on voltage may be greater than a threshold voltage of the cell transistor or the at least one ground selection transistor to which it is applied.

In performing the curing operation, a connection between a bit-line connected to a first vertical string of the vertical strings and a page buffer may be cut off, a turn-on voltage may be applied to a string selection line, each of a plurality word-lines and a ground selection line, (the first vertical string may include at least one string selection transistor connected to the string selection line, cell transistors connected to the word-lines and at least one ground selection transistor connected to the ground selection line), and a voltage of a common source line connected to the at least one ground selection transistor may be maintained at a ground voltage.

Each turn-on voltage may be greater than a threshold voltage of the at least one string selection transistor, the cell transistor or the at least one ground selection transistor to which it is applied.

The curing operation may be performed simultaneously on the vertical strings in the first memory block.

In an exemplary embodiment of the present inventive concept, the first memory operation may be performed sequentially on the memory blocks including the first memory block. When the memory blocks include at least one bad memory block, the curing operation may be performed simultaneously on other memory blocks of the memory blocks except the at least one bad memory block.

The curing operation may be performed on the other memory blocks except the at least one bad memory block based on a comparison of a block address for selecting the memory blocks and a bad block address set including an address designating the at least one bad block.

The bad block address set may include a first bad block address and a second bad block address, the first bad block address may be stored in a bad block address register of an address decoder connected to the memory blocks before a power-up sequence of the nonvolatile memory device, and the second bad block address may be stored in the bad block address register while the nonvolatile memory device is operating.

In an exemplary embodiment of the present inventive concept, a second memory operation may be performed on at least some portion of the first memory block after the curing operation is completed. The first memory operation may correspond to a read operation performed on the at least some portion of the first memory block and the second memory operation may correspond to a program operation performed on the at least some portion of the first memory block.

According to an exemplary embodiment of the present inventive concept, a nonvolatile memory device includes a memory cell array, a voltage generator, an address decoder and a control circuit. The memory cell array includes a plurality of memory blocks, and each of the memory blocks includes a plurality of vertical strings extending in a vertical direction with respect to a substrate. The voltage generator generates word-line voltages in response to a control signal. The address decoder provides the word-line voltages to the memory cell array in response to an address signal. The control circuit controls the voltage generator and the address decoder such that a first memory operation is performed on a first memory block of the memory blocks and a curing operation is performed on a portion of the first memory block in response to a command from a memory controller when a status signal indicates a ready state of the nonvolatile memory device during an interval equal to or greater than a reference interval after the first memory operation is completed.

In an exemplary embodiment of the present inventive concept, each of the vertical strings may include at least one string selection transistor connected to a bit-line connected to a page buffer, at least one ground selection transistor connected to a common source line and a plurality of cell transistors connected in series between the at least one string selection transistor and the at least one ground selection transistor. A vertical channel may be formed by the plurality of cell transistors.

In an exemplary embodiment of the present inventive concept, when the address decoder may perform the curing operation, the address decoder may turn off at least one string selection transistor of a first vertical string of the vertical strings, apply a turn-on voltage to each of a plurality of word-lines and a ground selection line (the first vertical string includes cell transistors connected to the word-lines and at least one ground selection transistor connected to the ground selection line), and maintain a voltage of a common source line connected to the at least one ground selection transistor at a ground voltage. Each turn-on voltage may be greater than a threshold voltage of the cell transistor or the at least one ground selection transistor to which it is applied.

In an exemplary embodiment of the present inventive concept, when the address decoder may perform the curing operation, the address decoder may cut off a connection between a bit-line connected to a first vertical string of the vertical strings and a page buffer, apply a turn-on voltage to a string selection line, each of a plurality of word-lines and a ground selection line (the first vertical string includes at least one string selection transistor connected to the string selection line, cell transistors connected to the word-lines and at least one ground selection transistor connected to the ground selection line), and maintain a voltage of a common source line connected to the at least one ground selection transistor at a ground voltage. Each turn-on voltage may be greater than a threshold voltage of the at least one string selection transistor, the cell transistor or the at least one ground selection transistor to which it is applied.

In an exemplary embodiment of the present inventive concept, the address decoder may include a bad block address register, an address comparator, a decoder and a plurality of selection circuits. The bad block address register may store an address designating at least one bad block of the memory blocks. The address comparator may compare a block address for selecting two or more memory blocks of the memory blocks with a bad block address set stored in the bad block address register and output a matching signal indicating whether the block address matches the bad block address set. The decoder may decode the match signal and the block address and provide a plurality of block selection signals. The plurality of selection circuits, connected to the memory blocks, may selectively provide turn-on voltages from the voltage generator to the memory blocks in response to the block selection signals, when the curing operation is performed.

The bad block address set may include a first bad block address and a second bad block address, the first bad block address may be stored in a bad block address register before a power-up sequence of the nonvolatile memory device, and the second bad block address may be stored in the bad block address register while the nonvolatile memory device is operating.

According to an exemplary embodiment of the present inventive concept, a memory system includes at least one nonvolatile memory device and a memory controller. The memory controller controls the at least one nonvolatile memory device. The at least one nonvolatile memory device includes a memory cell array, a voltage generator, an address decoder and a control circuit. The memory cell array includes a plurality of memory blocks, and each of the memory blocks includes a plurality of vertical strings extending in a vertical direction with respect to a substrate. The voltage generator generates word-line voltages in response to a control signal. The address decoder provides the word-line voltages to the memory cell array in response to an address signal. The control circuit controls the voltage generator and the address decoder such that a first memory operation is performed on a first memory block of the memory blocks and a curing operation is performed on a portion of the first memory block in response to a command from the memory controller when a status signal indicates a ready state of the nonvolatile memory device during an interval equal to or greater than a reference interval after the first memory operation is completed.

The control circuit may include a status signal generator. The status signal generator may provide the memory controller with the status signal indicating an operating state of the nonvolatile memory device in response to the command. The memory controller may include a counter and a processor. The counter may compare the status signal indicating the ready state with the reference interval to output a decision signal. The processor may generate the command in response to the decision signal and a request from a host.

The processor may transmit, to the at least one nonvolatile memory device, a command directing the curing operation when the decision signal indicates that the ready state is maintained during the interval equal to or greater than the reference interval.

According to an exemplary embodiment of the present inventive concept, a nonvolatile memory device includes: a memory cell array including a plurality of memory blocks, wherein a first memory block of the memory blocks includes a plurality of strings, and wherein a first string of the plurality of strings includes a plurality of transistors stacked in a direction substantially perpendicular to a substrate; and a control circuit configured to instruct a curing operation to be performed on the first memory block, wherein the curing operation is performed after the nonvolatile memory device has been in a ready state for a predetermined time after a first memory operation performed on the first memory block ends.

The first memory operation includes a program operation or an erase operation.

A status signal indicates the ready state and when the status signal has the ready state, the control circuit is provided with a command and an address directing the curing operation.

After the curing operation is performed, electrons of a channel layer of the first string that were moved away from a surface of the channel layer by the first memory operation move back to the surface of the channel layer.

BRIEF DESCRIPTION OF THE DRAWINGS

The above and other features of the present inventive concept will become more clearly understood by describing in detail exemplary embodiments thereof with reference to the accompanying drawings.

FIG. 12B is a timing diagram illustrating an operation of a memory system when the method of FIG. 12A is performed in accordance with an exemplary embodiment of the present inventive concept.

FIG. 13 is a flow chart illustrating a curing operation in the method of FIG. 12A according to an exemplary embodiment of the present inventive concept.

DETAILED DESCRIPTION OF THE EMBODIMENTS

Figure 1:
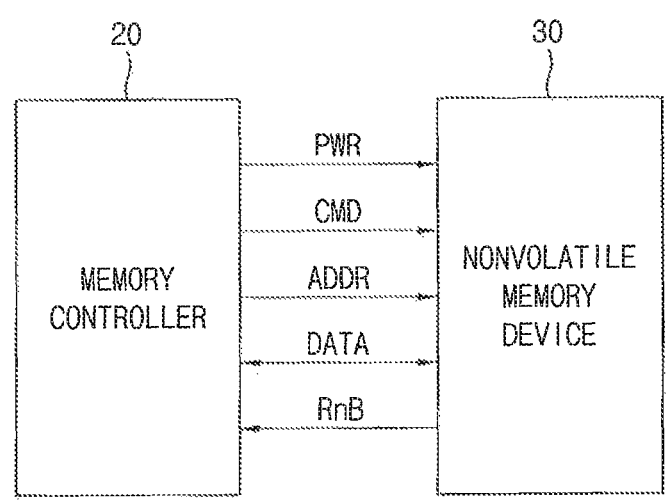
FIG. 1 is a block diagram illustrating a memory system according to an exemplary embodiment of the present inventive concept.

Exemplary embodiments of the present inventive concept will be described more fully hereinafter with reference to the accompanying drawings. The present inventive concept may, however, be embodied in many different forms and should not be construed as limited to the exemplary embodiments set forth herein. In the drawings, the sizes and relative sizes of layers and regions may be exaggerated for clarity. Like numerals may refer to like elements throughout this application. All elements shown in the drawings or hereinafter described may be composed of circuits.

It will be understood that when an element is referred to as being "connected" or "coupled" to another element, it can be directly connected or coupled to the other element or intervening elements may be present.

As used herein, the singular forms "a," "an" and "the" are intended to include the plural forms as well, unless the context clearly indicates otherwise.

FIG. 1 is a block diagram illustrating a memory system according to an exemplary embodiment of the present inventive concept.

Referring to FIG. 1, a memory system (or, a nonvolatile memory system) 10 may include a memory controller 20 and at least one nonvolatile memory device 30.

The memory system 10 may include flash memory based data storage media such as a memory card, a universal serial bus (USB) memory and a solid state drive (SSD).

The nonvolatile memory device 30 may perform an erase operation, a program operation and a read operation under control of the memory controller 20. The nonvolatile memory device 30 receives a command CMD, an address ADDR and data DATA through input/output lines from the memory controller 20 to perform such operations. In addition, the nonvolatile memory device 30 receives power PWR through a power line from the memory controller 20. The command CMD may include a command latch enable (CLE), an address latch enable (ALE), a chip enable (CE/), a write enable (WE/) and a read enable (RE/). The nonvolatile memory device 30 may transmit a status signal RnB to the memory controller 20. The status signal RnB may indicate an operating state of the nonvolatile memory device 30. For example, the status signal RnB may have a first logic level when the status signal RnB indicates a busy state of the nonvolatile memory device 30 and the status signal RnB may have a second logic level when the status signal RnB indicates a ready state (or, an idle state) of the nonvolatile memory device 30.

When the nonvolatile memory device 30 performs a program operation, the status signal RnB indicates a busy state. When the nonvolatile memory device 30 does not perform operations such as a program operation, a read operation and an erase operation, the status signal RnB indicates a ready state. When the status signal RnB indicates the ready state, the memory controller 20 may compare the status signal RnB indicating the ready state with a reference interval and may transmit, to the nonvolatile memory device 30, the command CMD and the address ADDR which direct a curing operation. The nonvolatile memory device 30 may perform the curing operation on a memory region designated by the address ADDR, in response to the command CMD.

Figure 2A:
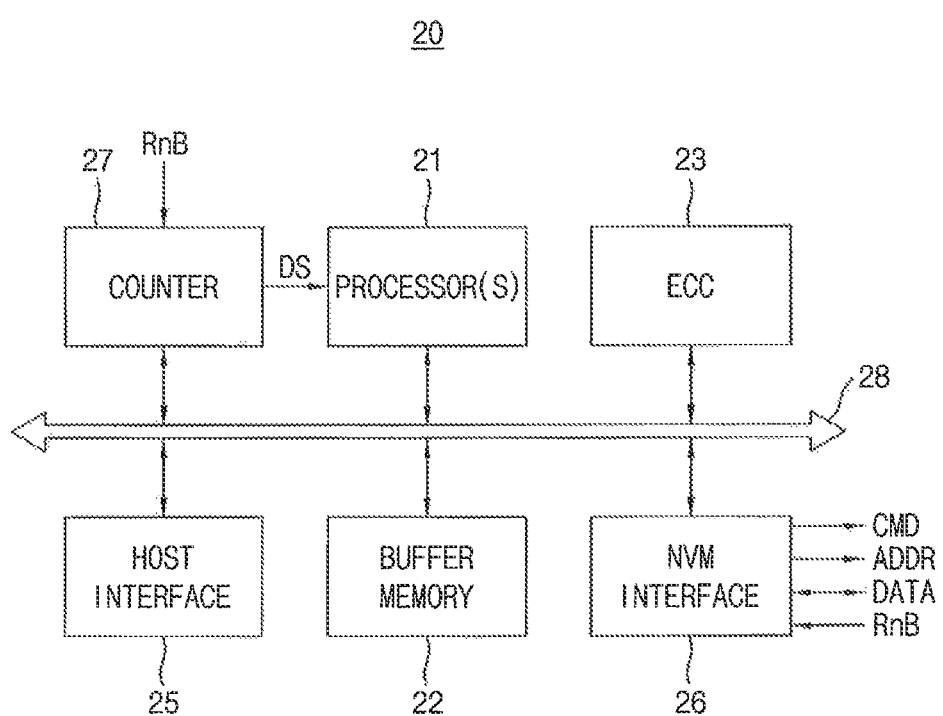
FIG. 2A illustrates a memory controller in the memory system of FIG. 1 according to an exemplary embodiment of the present inventive concept.

FIG. 2A illustrates the memory controller in the memory system of FIG. 1 according to an exemplary embodiment of the present inventive concept.

Referring to FIG. 2A, the memory controller 20 may include one or more processors 21, a buffer memory 22, an error correction circuit 23, a host interface 25, a nonvolatile memory interface 26 and a counter 27. These components are connected to a bus 28 for communication purposes.

The buffer memory 22 stores data used to drive the memory controller 20. In addition, the buffer memory 22 stores data used to perform a program operation when a host issues a write request to the memory controller 20.

The error correction circuit 23 calculates error correction code values of data to be programmed at a writing operation and corrects an error of read data by using an error correction code value at a read operation. In a data recovery operation, the error correction circuit 23 corrects an error of data recovered from the nonvolatile memory device 30. The memory controller 20 may further include a code memory to store code data used to drive the memory controller 20. The code memory may be implemented by a nonvolatile memory device.

The host interface 25 provides an interface with an external host. The nonvolatile memory interface 26 provides an interface with the nonvolatile memory device 30.

The counter 27 receives the status signal RnB from the nonvolatile memory interface 26. When the status signal RnB indicates the ready state, the counter 27 may compare the status signal RnB indicating the ready state with the reference interval and may provide a decision signal DS to the processor 21 when the ready state is maintained for an interval equal to or greater than the reference interval. The processor 21 may generate a command and an address which direct the curing operation in response to the decision signal DS that indicated the ready state was maintained for an interval equal to or greater than the reference interval. The processor 21 may provide the nonvolatile memory device 30 with the generated command and address through the nonvolatile memory interface 26.

Figure 2B:
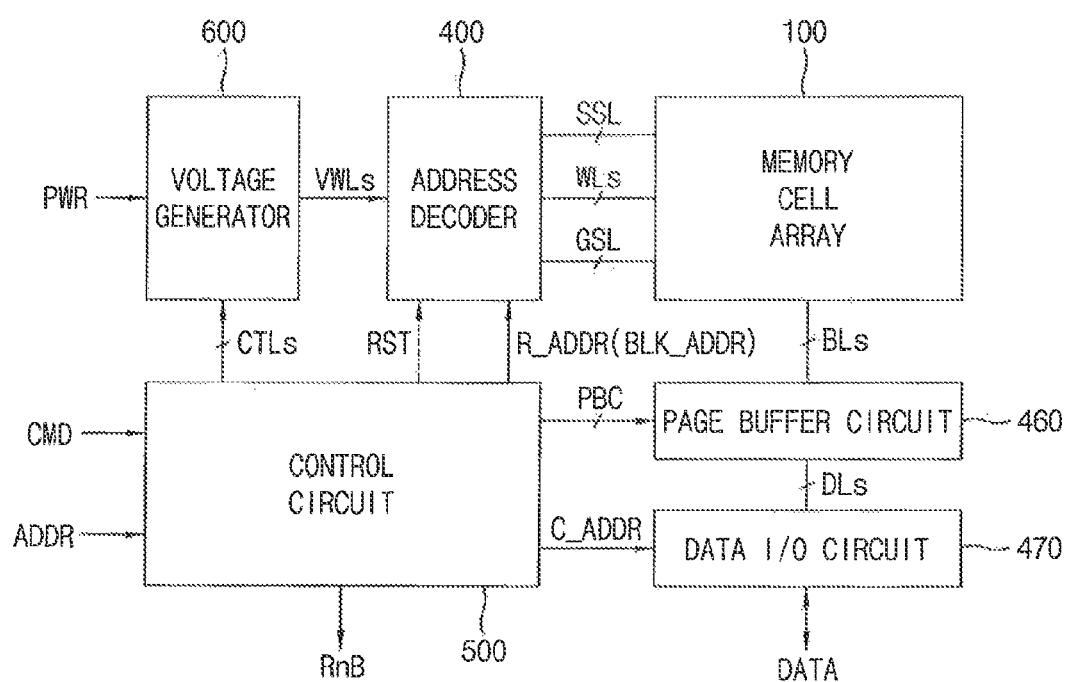
FIG. 2B is a block diagram illustrating a nonvolatile memory device in the memory system of FIG. 1 according to an exemplary embodiment of the present inventive concept.

FIG. 2B is a block diagram illustrating the nonvolatile memory device in the memory system of FIG. 1 according to an exemplary embodiment of the present inventive concept.

Referring to FIG. 2B, the nonvolatile memory device 30 includes a memory cell array 100, an address decoder 400, a page buffer circuit 460, a data input/output circuit 470, a control circuit 500 and a voltage generator 600.

The memory cell array 100 may be coupled to the address decoder 400 through at least one string selection line SSL, a plurality of word-lines WLs, and at least one ground selection line GSL. In addition, the memory cell array 100 may be coupled to the page buffer circuit 460 through a plurality of bit-lines BLs.

The memory cell array 100 may include a plurality of memory cells coupled to the plurality of word-lines WLs and the plurality of bit-lines BLs.

In an exemplary embodiment of the present inventive concept, the memory cell array 100 may be a three-dimensional memory cell array, which is formed on a substrate in a three-dimensional structure (or a vertical structure). In this case, the memory cell array 100 may include vertical cell strings that are vertically oriented such that at least one memory cell is located over another memory cell. The following patent documents, which are hereby incorporated by reference in their entireties, describe configurations of three-dimensional memory cell arrays: U.S. Pat. Nos. 7,679,133; 8,553,466; 8,654,587; 8,559,235; and U.S. Pat. Pub. No. 2011/0233648.

Figure 3:
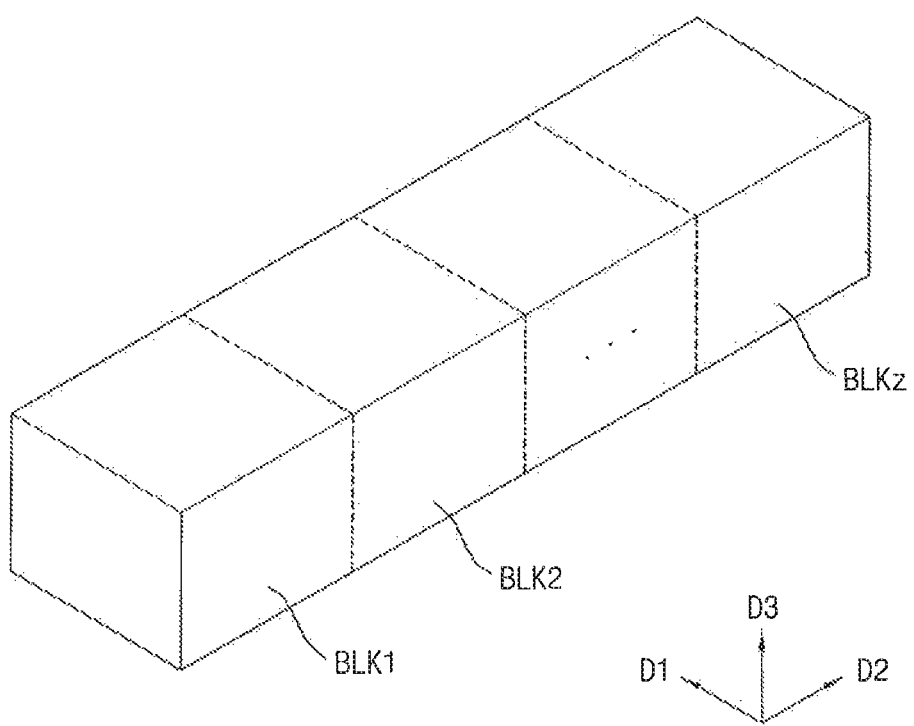
FIG. 3 is a block diagram illustrating a memory cell array in FIG. 2B according to an exemplary embodiment of the present inventive concept.

FIG. 3 is a block diagram illustrating the memory cell array in FIG. 2B according to an exemplary embodiment of the present inventive concept.

Referring to FIG. 3, the memory cell array 100 may include a plurality of memory blocks BLK1 to BLKz. In an exemplary embodiment of the present inventive concept, the memory blocks BLK1 to BLKz are selected by the address decoder 400 in FIG. 2B. For example, the address decoder 400 may select a memory block BLK corresponding to a block address among the memory blocks BLK1 to BLKz. In addition, the address decoder 400 may select two or more memory blocks corresponding to a block address among the memory blocks BLK1 to BLKz.

Figure 4:
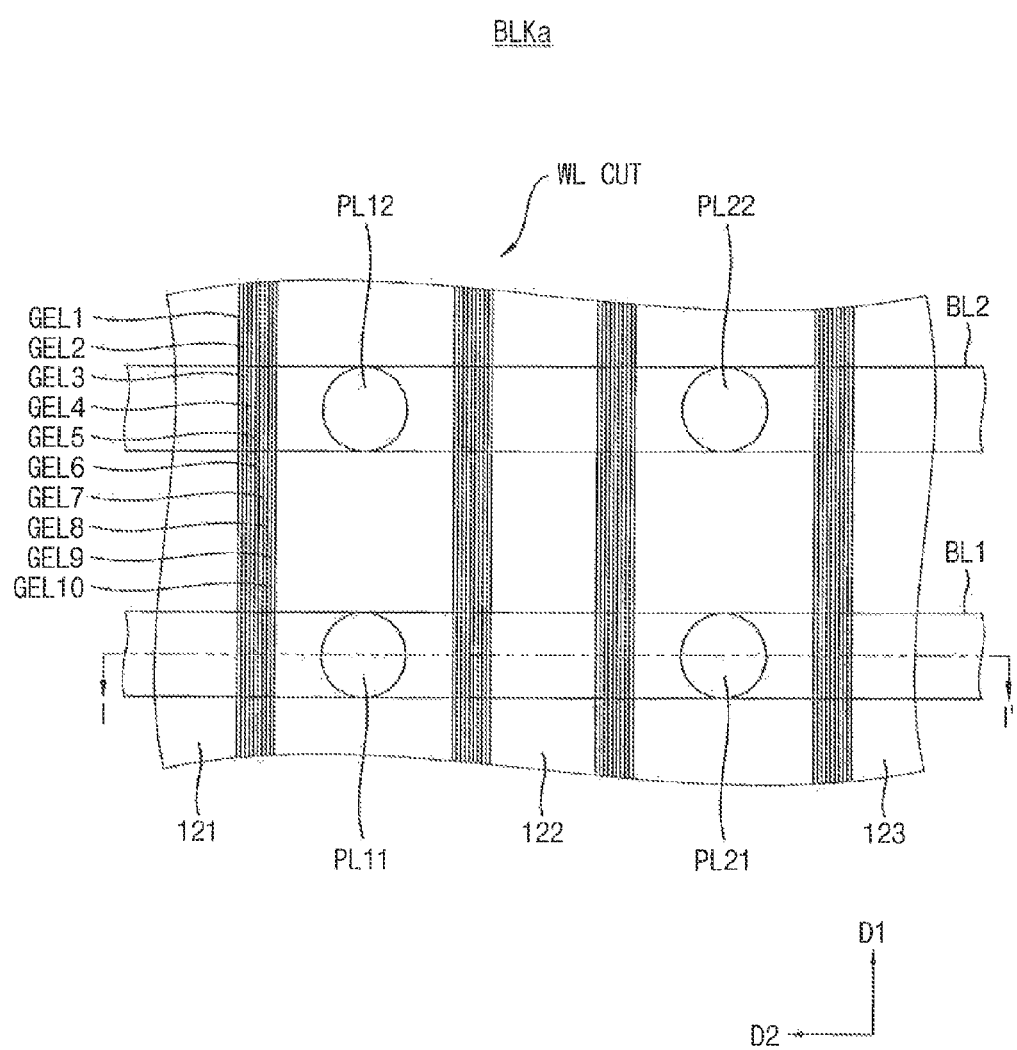
FIG. 4 is a perspective view illustrating a memory block of FIG. 2B according to an exemplary embodiment of the present inventive concept.
Figure 5:
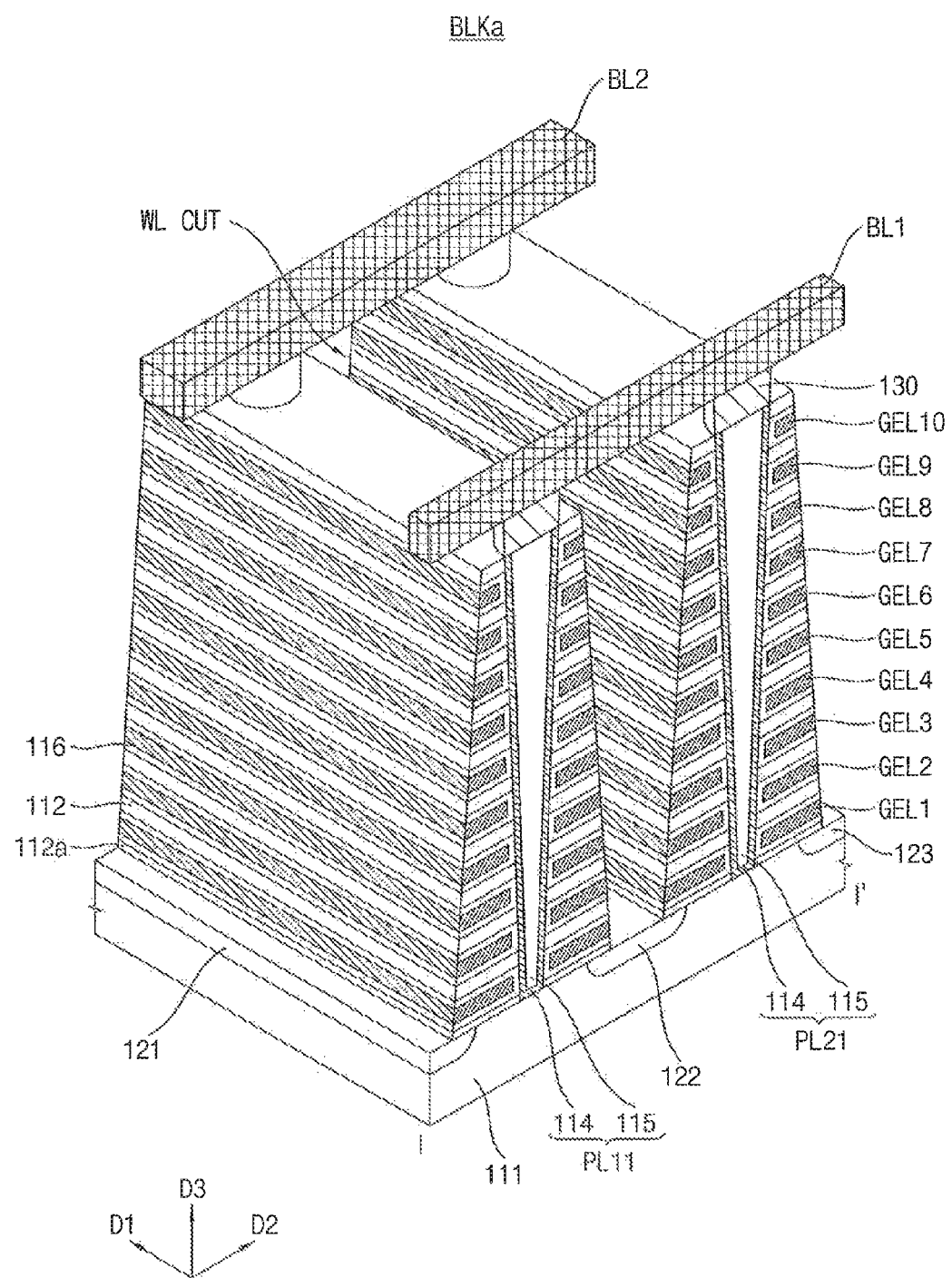
FIG. 5 is a perspective view taken along a line I-I' of the memory block of FIG. 4 according to an exemplary embodiment of the present inventive concept.
Figure 6:
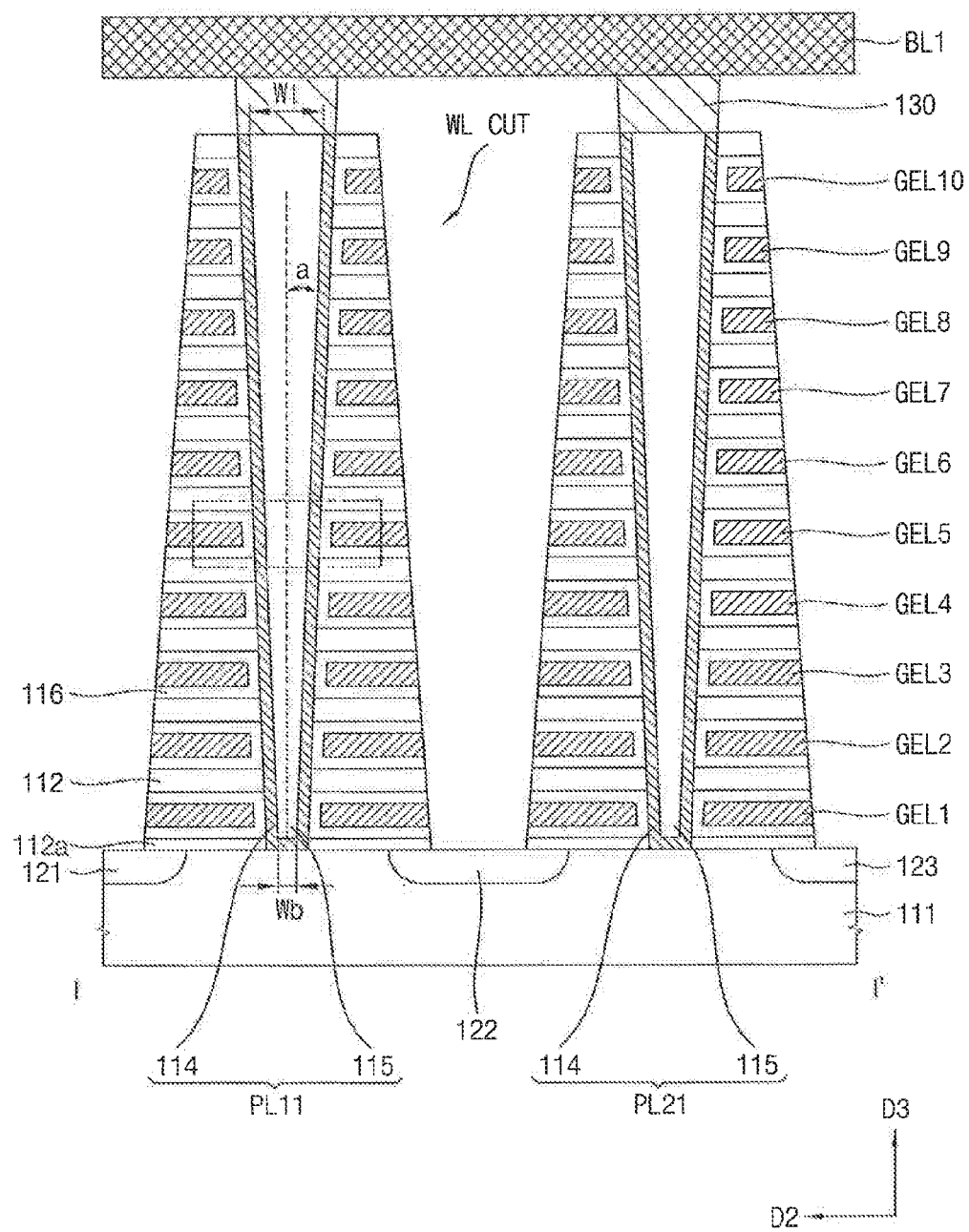
FIG. 6 is a cross-sectional view taken along the line I-I' of the memory block of FIG. 4 according to an exemplary embodiment of the present inventive concept.

FIG. 4 is a perspective view illustrating one of the memory blocks of FIG. 2B according to an exemplary embodiment of the present inventive concept. FIG. 5 is a perspective view taken along a line I-I' of the memory block of FIG. 4 according to an exemplary embodiment of the present inventive concept. FIG. 6 is a cross-sectional view taken along the line I-I' of the memory block of FIG. 4 according to an exemplary embodiment of the present inventive concept.

FIGS. 4, 5 and 6 illustrate a portion of a memory block BLKa of the memory blocks BLK1 to BLKz in the memory cell array 100 of FIG. 2B.

Referring to FIGS. 4, 5 and 6, the memory block BLKa may be formed on a substrate 111 along first, second and third directions D1, D2 and D3 such that the memory block BLKa has a three-dimensional structure.

The substrate 111 may be a well having a first conductivity type. For example, the substrate 111 may be a p-well in which a Group III element such as boron is injected. In an exemplary embodiment of the present inventive concept, the substrate 111 may be a pocket p-well which is provided within an n-well. Hereinafter, it is assumed that the substrate 111 is a p-well (or, a pocket p-well). However, exemplary embodiments of the present inventive concept are not limited thereto.

A plurality of doping regions 121, 122 and 123, which are extended along the first direction D1 and are spaced apart along the second direction D2, may be formed in the substrate 111. In FIGS. 4, 5 and 6, a first doping region 121, a second doping region 122 and a third doping region 123 are illustrated as an example.

The plurality of doping regions 121, 122 and 123 may have a second conductivity type that is different from the first conductivity type of the substrate 111. For example, the plurality of doping regions 121, 122 and 123 may include an n-type conductive material. Hereinafter, it is assumed that the plurality of doping regions 121, 122 and 123 are n-type. However, exemplary embodiments of the present inventive concept are not limited thereto.

As will be described later, the plurality of doping regions 121, 122 and 123 may be coupled to a common source line.

Between adjacent doping regions of the plurality of doping regions 121, 122 and 123, a plurality of insulation layers 112 and 112a may be formed sequentially on the substrate 111 along the third direction D3, which is a direction perpendicular to the substrate 111. The plurality of insulation layers 112 and 112a may be formed to be spaced apart along the third direction D3. The plurality of insulation layers 112 and 112a may be extended along the first direction D1.

In an exemplary embodiment of the present inventive concept, the plurality of insulation layers 112 and 112a may include an insulating material such as silicon oxide.

In an exemplary embodiment of the present inventive concept, a thickness of the insulation layer 112a contacting with the substrate 111 may be thinner than that of the insulation layers 112.

Between adjacent doping regions of the plurality of doping regions 121, 122 and 123, a plurality of pillars PL11, PL12, PL21 and PL22, which are arranged sequentially along the first direction D1 and penetrate the plurality of insulation layers 112 and 112a along the third direction D3, may be formed. The plurality of pillars PL11, PL12, PL21 and PL22 may contact with the substrate 111 through the plurality of insulation layers 112 and 112a.

In an exemplary embodiment of the present inventive concept, the plurality of pillars PL11, PL12, PL21 and PL22 may be formed by vertically patterning the plurality of insulation layers 112 and 112a.

In an exemplary embodiment of the present inventive concept, each of the plurality of pillars PL11, PL12, PL21 and PL22 may include an inner material 115 and a channel layer 114 surrounding the inner material 115.

The channel layer 114 may include a semiconductor material (e.g., silicon) having the same conductive type as the substrate 111, which is the first conductive type. For example, the channel layer 114 may include a p-type semiconductor material. Hereinafter, it is assumed that the channel layer 114 is p-type. However, exemplary embodiments of the present inventive concept are not limited thereto. For example, the channel layer 114 may include an intrinsic semiconductor which is a nonconductor.

The inner material 115 may include an insulation material. In an exemplary embodiment of the present inventive concept, the inner material 115 may include silicon oxide. In an exemplary embodiment of the present inventive concept, the inner material 115 may include an air gap.

As illustrated in FIGS. 5 and 6, between adjacent doping regions of the plurality of doping regions 121, 122 and 123, charge storage layers 116 may be formed along exposed surfaces of the plurality of insulation layers 112 and 112a and the channel layers 114. The charge storage layers 116 may store data by trapping charges from the channel layers 114.

As illustrated in FIGS. 5 and 6, a plurality of gate electrode layers GEL1, GEL2, GEL3, GEL4, GEL5, GEL6, GEL7, GEL8, GEL9 and GEL10 may be formed in a space surrounded by the charge storage layers 116. Heights of the plurality of gate electrode layers GEL1, GEL2, GEL3, GEL4, GEL5, GEL6, GEL7, GEL8, GEL9 and GEL10 from the substrate 111 may be different from each other. In FIGS. 4, 5 and 6, the memory block BLKa is illustrated to include first through tenth gate electrode layers GEL1, GEL2, GEL3, GEL4, GEL5, GEL6, GEL7, GEL8, GEL9 and GEL10 as an example. However, the number of gate electrode layers is not limited thereto.

In an exemplary embodiment of the present inventive concept, the plurality of gate electrode layers GEL1, GEL2, GEL3, GEL4, GEL5, GEL6, GEL7, GEL8, GEL9 and GEL10 may include a metallic conductive material such as tungsten.

In an exemplary embodiment of the present inventive concept, the plurality of gate electrode layers GEL1, GEL2, GEL3, GEL4, GEL5, GEL6, GEL7, GEL8, GEL9 and GEL10 may include a nonmetallic conductive material such as polysilicon.

The plurality of gate electrode layers GEL1, GEL2, GEL3, GEL4, GEL5, GEL6, GEL7, GEL8, GEL9 and GEL10 may be extended along the first direction D1.

As illustrated in FIGS. 5 and 6, the plurality of insulation layers 112 and 112a and the plurality of gate electrode layers GEL1, GEL2, GEL3, GEL4, GEL5, GEL6, GEL7, GEL8, GEL9 and GEL10 may be arranged alternately along the third direction D3, which is a direction perpendicular to the substrate 111, and the charge storage layers 116 may be formed between the plurality of insulation layers 112 and 112a and the plurality of gate electrode layers GEL1, GEL2, GEL3, GEL4, GEL5, GEL6, GEL7, GEL8, GEL9 and GEL10. In addition, the plurality of gate electrode layers GEL1, GEL2, GEL3, GEL4, GEL5, GEL6, GEL7, GEL8, GEL9 and GEL10, the charge storage layers 116 and the channel layers 114 may be arranged sequentially along the second direction D2.

The plurality of gate electrode layers GEL1, GEL2, GEL3, GEL4, GEL5, GEL6, GEL7, GEL8, GEL9 and GEL10 may be separated on the plurality of doping regions 121, 122 and 123 by word line cuts WL CUT. The word line cuts WL CUT may expose the plurality of doping regions 121, 122 and 123. The word line cuts WL CUT may be extended along the first direction D1.

In an exemplary embodiment of the present inventive concept, a charge storage layer 116 formed on an upper surface of an uppermost insulation layer among the plurality of insulation layers 112 and 112a may be removed.

A plurality of drains 130 may be formed on the plurality of pillars PL11, PL12, PL21 and PL22, respectively. In an exemplary embodiment of the present inventive concept, the plurality of drains 130 may include a semiconductor material (e.g., silicon) having the second conductivity type. For example, the plurality of drains 130 may include an n-type semiconductor material. Hereinafter, it is assumed that the plurality of drains 130 is n-type. However, exemplary embodiments of the present inventive concept are not limited thereto.

A plurality of bit-lines BL1 and BL2, which are extended in the second direction D2 and are spaced apart along the first direction D1, may be formed on the plurality of drains 130. In an exemplary embodiment of the present inventive concept, the plurality of bit-lines BL1 and BL2 and the plurality of drains 130 may be connected via contact plugs.

In an exemplary embodiment of the present inventive concept, the plurality of bit-lines BL1 and BL2 may include a metallic conductive material.

In an exemplary embodiment of the present inventive concept, the plurality of bit-lines BL1 and BL2 may include a nonmetallic conductive material such as polysilicon.

Each of the plurality of pillars PL11, PL12, PL21 and PL22 together with adjacent charge storage layers 116 and adjacent gate electrode layers GEL1, GEL2, GEL3, GEL4, GEL5, GEL6, GEL7, GEL8, GEL9 and GEL10 may constitute one cell string. As illustrated in FIGS. 4, 5 and 6, since the plurality of pillars PL11, PL12, PL21 and PL22 are formed on the substrate 111, the memory block BLKa may include a plurality of cell strings.

Each of the plurality of cell strings may include a plurality of cell transistors CT stacked in a direction perpendicular to the substrate 111, e.g., the third direction D3. Each of the plurality of gate electrode layers GEL1, GEL2, GEL3, GEL4, GEL5, GEL6, GEL7, GEL8, GEL9 and GEL10 may act as a gate electrode of the cell transistor CT, and the channel layer 114 included in each of the plurality of pillars PL11, PL12, PL21 and PL22 may act as a body of the cell transistor CT.

Figure 7:
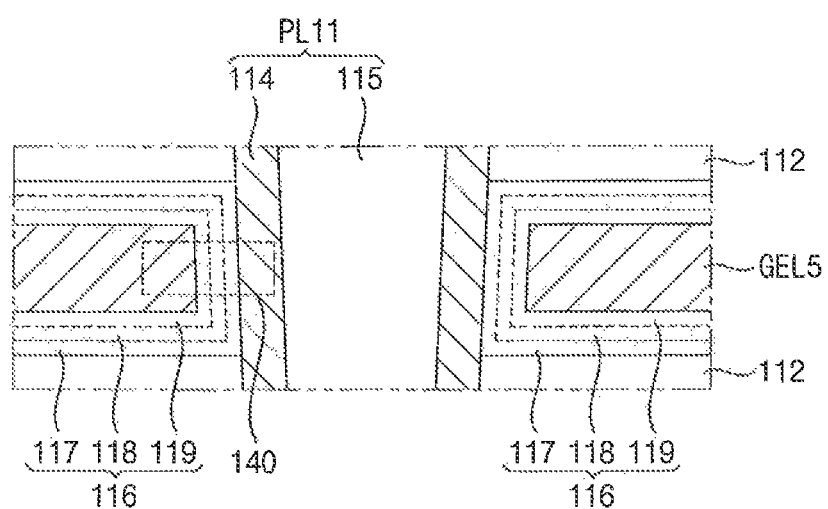
FIG. 7 is a diagram illustrating a cell transistor included in a memory block of FIGS. 4, 5 and 6 according to an exemplary embodiment of the present inventive concept.

FIG. 7 is a diagram illustrating a cell transistor included in a memory block of FIGS. 4, 5 and 6 according to an exemplary embodiment of the present inventive concept.

In FIG. 7, a cell transistor CT, which corresponds to a pillar PL11 and includes a fifth gate electrode layer GEL5, is illustrated as an example.

Referring to FIG. 7, the cell transistor CT may include the fifth gate electrode layer GEL5, a portion of the pillar PL11 adjacent to the fifth gate electrode layer GEL5, and the charge storage layer 116 formed between the fifth gate electrode layer GEL5 and the pillar PL11.

The channel layer 114 included in the pillar PL11 may include the same p-type silicon as the substrate 111. The channel layer 114 may act as a body of the cell transistor CT. Since the channel layer 114 is formed in a direction perpendicular to the substrate 111, the channel layer 114 may act as a vertical body of the cell transistor CT. A vertical channel may be formed at the channel layer 114 when the cell transistor CT operates.

The charge storage layer 116 may include the first through third sub insulation layers 117, 118 and 119.

The first sub insulation layer 117 may be formed adjacent to the pillar PL11. The first sub insulation layer 117 may act as a tunneling insulation layer of the cell transistor CT. In an exemplary embodiment of the present inventive concept, the first sub insulation layer 117 may include a thermal oxide layer. In an exemplary embodiment of the present inventive concept, the first sub insulation layer 117 may include a silicon oxide layer.

The second sub insulation layer 118 may store charges tunneling from the channel layer 114 through the first sub insulation layer 117. For example, the second sub insulation layer 118 may act as a charge trap layer of the cell transistor CT. In an exemplary embodiment of the present inventive concept, the second sub insulation layer 118 may include a nitride layer. In an exemplary embodiment of the present inventive concept, the second sub insulation layer 118 may include a metal oxide layer.

The third sub insulation layer 119 may be formed adjacent to the fifth gate electrode layer GEL5. The third sub insulation layer 119 may act as a blocking insulation layer of the cell transistor CT. The third sub insulation layer 119 may be formed of a single layer or multiple layers. The third sub insulation layer 119 may be a high dielectric layer having a dielectric constant larger than those of the first and second sub insulation layers 117 and 118. In an exemplary embodiment of the present inventive concept, the third sub insulation layer 119 may include a silicon oxide layer.

In an exemplary embodiment of the present inventive concept, the first through third sub insulation layers 117, 118 and 119 may include oxide-nitride-oxide (ONO).

The fifth gate electrode layer GEL5 may act as a gate electrode of the cell transistor CT.

For example, the plurality of gate electrode layers GEL1, GEL2, GEL3, GEL4, GEL5, GEL6, GEL7, GEL8, GEL9 and GEL10 acting as gate electrodes, the third sub insulation layers 119 acting as blocking insulation layers, the second sub insulation layers 118 acting as charge trap layers, the first sub insulation layers 117 acting as tunneling insulation layers, and the channel layers 114 acting as vertical bodies may constitute the cell transistors CT stacked in a direction perpendicular to the substrate 111.

Each of the cell transistors CT may have a cylindrical shape centered on a corresponding one of the plurality of pillars PL11, PL12, PL21 and PL22.

As will described below with reference to FIG. 6, the cell transistors CT included in the memory block BLKa may be used for different purposes according to height.

In an exemplary embodiment of the present inventive concept, among the cell transistors CT, at least one cell transistor placed at an upper portion may be used as a string selection transistor SST. For example, the cell transistor CT including the tenth gate electrode layer GEL10 may operate as the string selection transistor SST. In an exemplary embodiment of the present inventive concept, the charge storage layer 116 may not be formed in the cell transistor CT operating as the string selection transistor SST.

In an exemplary embodiment of the present inventive concept, among the cell transistors CT, at least one cell transistor placed at a lower portion may be used as a ground selection transistor GST. For example, the cell transistor CT including the first gate electrode layer GEL1 may operate as the ground selection transistor GST. In an exemplary embodiment of the present inventive concept, the charge storage layer 116 may not be formed in the cell transistor CT operating as the ground selection transistor GST.

In an exemplary embodiment of the present inventive concept, among the cell transistors CT, cell transistors placed between the at least one string selection transistor SST and the at least one ground selection transistor GST may be used as memory cells. For example, the cell transistors CT including the second through ninth gate electrode layers GEL2, GEL3, GEL4, GEL5, GEL6, GEL7, GEL8 and GEL9 may operate as first through eighth memory cells MC1, MC2, MC3, MC4, MC5, MC6, MC7 and MC8, respectively. The memory cell may also be referred to as a cell transistor.

In an exemplary embodiment of the present inventive concept, the tenth gate electrode layer GEL10, which corresponds to a gate electrode of the string selection transistor SST, may be connected to the string selection line SSL, the first gate electrode layer GEL1, which corresponds to a gate electrode of the ground selection transistor GST, may be connected to the ground selection line GSL, and the second through ninth gate electrode layers GEL2, GEL3, GEL4, GEL5, GEL6, GEL7, GEL8 and GEL9, which correspond to gate electrodes of the memory cells, may be connected to first through eighth word lines WL1, WL2, WL3, WL4, WL5, WL6, WL7 and WL8, respectively.

Figure 8:
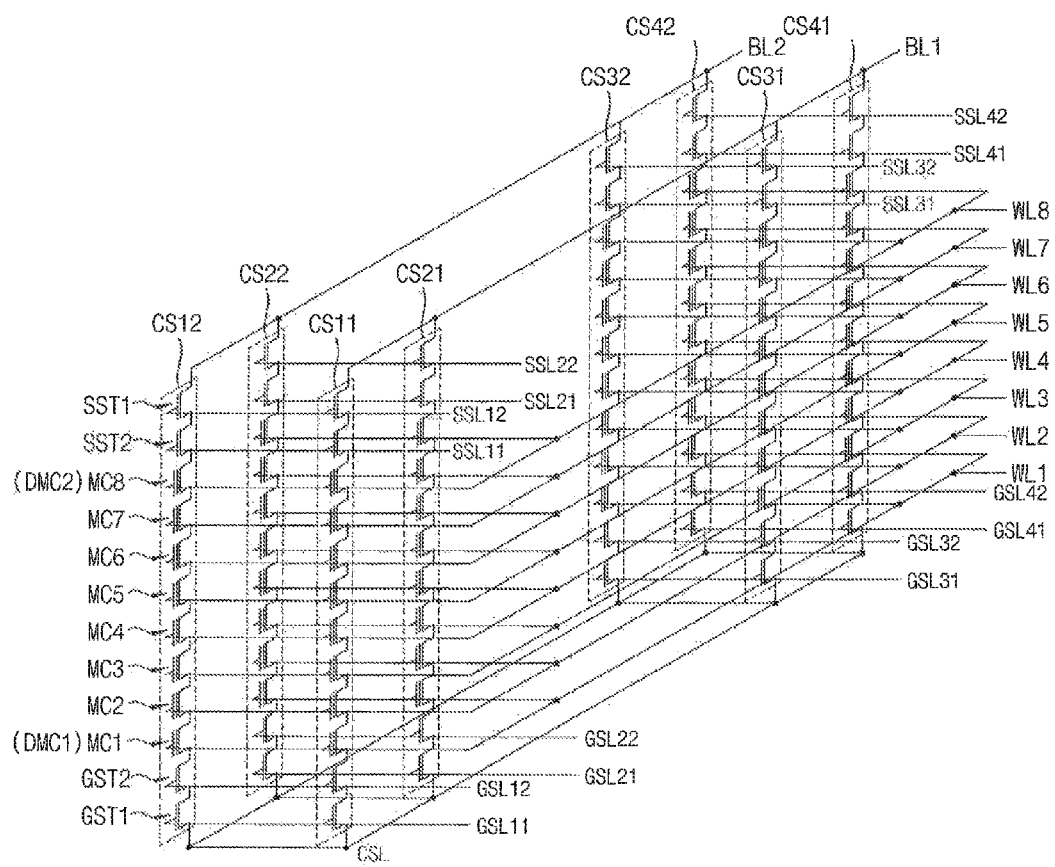
FIG. 8 is a circuit diagram illustrating an equivalent circuit of a memory block of FIGS. 4, 5 and 6 according to an exemplary embodiment of the present inventive concept.

FIG. 8 is a circuit diagram illustrating an equivalent circuit of a memory block of FIGS. 4, 5 and 6 according to an exemplary embodiment of the present inventive concept.

In FIG. 8, it is assumed that the memory block BLKa of FIGS. 4, 5 and 6 includes a first additional gate electrode layer above the tenth gate electrode layer GEL10 and a second additional gate electrode layer below the first gate electrode layer GEL1.

Referring to FIGS. 4 to 8, the plurality of doping regions 121, 122 and 123 may be connected to a common source line CSL.

A plurality of vertical strings CS11, CS12, CS21, CS22, CS31, CS32, CS41 and CS42 may be formed between the plurality of bit-lines BL1 and BL2 and the common source line CSL. Vertical strings CS11, CS21, CS31 and CS41 may be coupled between the first bit-line BL1 and the common source line CSL. Vertical strings CS12, CS22, CS32 and CS42 may be coupled between the second bit-line BL2 and the common source line CSL.

The plurality of vertical strings CS11, CS12, CS21 and CS22 illustrated in FIG. 8 may correspond to the plurality of pillars PL11, PL12, PL21 and PL22, respectively. For example, the four pillars PL11, PL12, PL21 and PL22, the plurality of gate electrode layers GEL1, GEL2, GEL3, GEL4, GEL5, GEL6, GEL7, GEL8, GEL9 and GEL10, and the charge storage layers 116 may form the four vertical strings CS11, CS12, CS21 and CS22.

In an exemplary embodiment of the present inventive concept, the first gate electrode layer GEL1 together with the charge storage layers 116 and the plurality of pillars PL11, PL12, PL21 and PL22 may constitute ground selection transistors GST2. In an exemplary embodiment of the present inventive concept, the first gate electrode layer GEL1, which corresponds to the gate electrodes of the ground selection transistors GST2, may be connected to ground selection lines GSL12 and GSL22. For example, the ground selection transistors GST2 arranged along the first direction D1 may be connected to a same ground selection line, and the ground selection transistors GST2 spaced apart along the second direction D2 may be connected to different ground selection lines from each other. In an exemplary embodiment of the present inventive concept, all ground selection transistors GST2 including the first gate electrode layer GEL1 may be connected to a same ground selection line. Ground selection lines GSL11, GSL21, GSL31, GSL32, GSL41 and GSL42 are further shown in FIG. 8.

In an exemplary embodiment of the present inventive concept, the second through ninth gate electrode layers GEL2, GEL3, GEL4, GEL5, GEL6, GEL7, GEL8 and GEL9 together with the charge storage layers 116 and the plurality of pillars PL11, PL12, PL21 and PL22 may constitute the first through eighth memory cells MC1, MC2, MC3, MC4, MC5, MC6, MC7 and MC8. The second through ninth gate electrode layers GEL2, GEL3, GEL4, GEL5, GEL6, GEL7, GEL8 and GEL9, which correspond to the gate electrodes of the first through eighth memory cells MC1, MC2, MC3, MC4, MC5, MC6, MC7 and MC8, may be connected to the first through eighth word lines WL1, WL2, WL3, WL4, WL5, WL6, WL7 and WL8, respectively. In other words, memory cells formed at a same height may be commonly connected to a same word line. When a voltage is applied to a selected word line among the plurality of word lines WL1, WL2, WL3, WL4, WL5, WL6, WL7 and WL8, the voltage may be applied to all memory cells connected to the selected word line in the plurality of verticals strings CS11, CS12, CS21 and CS22.

In an exemplary embodiment of the present inventive concept, the first memory cell MC1 and the eighth memory cell MC8 may be implemented with dummy memory cells DMC1 and DMC2.

In an exemplary embodiment of the present inventive concept, the tenth gate electrode layer GEL10 together with the charge storage layers 116 and the plurality of pillars PL11, PL12, PL21 and PL22 may constitute the string selection transistors SST2. The tenth gate electrode layer GEL10, which corresponds to the gate electrodes of the string selection transistors SST2, may be connected to the string selection lines SSL11 and SSL21. For example, the string selection transistors SST2 arranged along the first direction D1 may be connected to a same string selection line, and the string selection transistors SST2 spaced apart along the second direction D2 may be connected to different string selection lines from each other.

Figure 9:
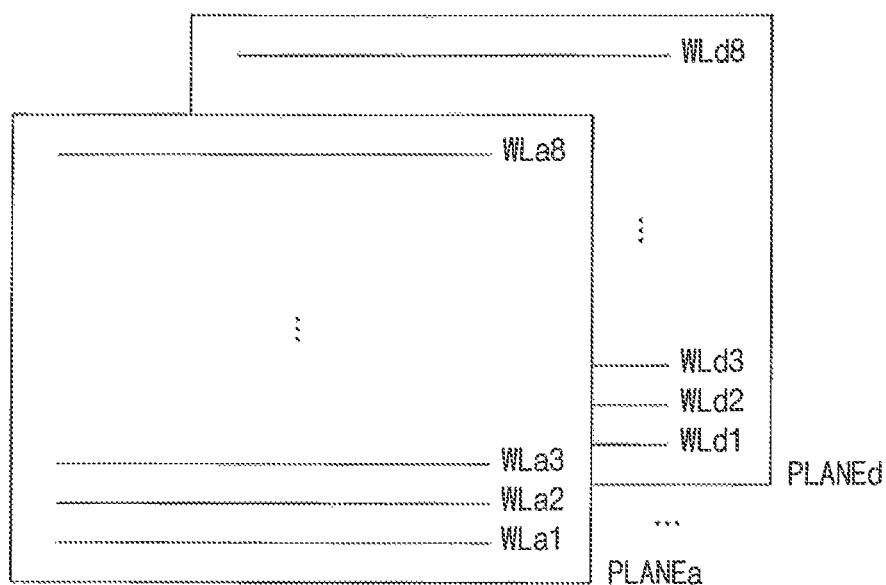
FIG. 9 is a diagram illustrating a plane structure of an equivalent circuit diagram of FIG. 8 according to an exemplary embodiment of the present inventive concept.

FIG. 9 is a diagram illustrating a plane structure of an equivalent circuit diagram of FIG. 8 according to an exemplary embodiment of the present inventive concept.

Referring to FIGS. 4 to 9, the equivalent circuit diagram of FIG. 8 may include four planes. In FIG. 8, the vertical strings CS11 and CS12 may constitute a first plane PLANEa, the vertical strings CS21 and CS22 may constitute a second plane PLANEb, the vertical strings CS31 and CS32 may constitute a third plane PLANEc, and the vertical strings CS41 and CS42 may constitute a fourth plane PLANEd. The first word-line WL1 may be divided into first sub word-lines WLa1 through WLd1 according to the planes, the second word-line WL2 may be divided into second sub word-lines WLa2 through WLd2 according to the planes, the third word-line WL3 may be divided into third sub word-lines WLa3 through WLd3 according to the planes, the fourth word-line WL4 may be divided into fourth sub word-lines WLa4 through WLd4 according to the planes, the fifth word-line WL5 may be divided into fifth sub word-lines WLa5 and WLd5 according to the planes, the sixth word-line WL6 may be divided into sixth sub word-lines WLa6 through WLd6 according to the planes, the seventh word-line WL7 may be divided into seventh sub word-lines WLa7 through WLd7 according to the planes, and the eighth word-line WL8 may be divided into eighth sub word-lines WLa8 through WLd8 according to the planes.

Vertical strings arranged in a same plane may be connected to a same string selection line, and vertical strings arranged in different planes may be connected to different string selection lines from each other. For example, the vertical strings CS11 and CS12 arranged in the first plane PLANEa may be connected to first string selection line SSL11 and SSL12, and the vertical strings CS21 and CS22 arranged in the second plane PLANEb may be connected to second string selection lines SSL21 and SSL22.

Vertical strings may be selected by a unit of a plane by selecting one pair of the string selection lines SSL11, SSL12, SSL21, SSL22, SSL31, SSL32, SSL41, and SS42. For example, when the first string selection lines SSL11 and SSL12 are selected, the vertical strings CS11 and CS12 connected to the first string selection lines SSL11 and SSL12 may be electrically connected to the plurality of bit-lines BL1 and BL2, and the vertical strings CS21 and CS22 connected to the second string selection lines SSL21 and SSL22, which are unselected, may be electrically disconnected from the plurality of bit-lines BL1 and BL2.

Vertical strings arranged along the second direction D2 may be connected to a same bit-line, and vertical strings spaced apart along the first direction D1 may be connected to different bit-lines from each other. For example, the vertical strings CS11 and CS21 may be connected to the first bit-line BL1, and the vertical strings CS12 and CS22 may be connected to the second bit-line BL2.

In FIGS. 4 to 8, each vertical string is illustrated to include two string selection transistors SST1 and SST2, two ground selection transistors GST1 and GST2, and the first through eighth memory cells MC1, MC2, MC3, MC4, MC5, MC6, MC7 and MC8 arranged between the string selection transistor SST2 and the ground selection transistor GST2 as an example. However, numbers of the string selection transistor SST, the ground selection transistor GST and the memory cells MC1, MC2, MC3, MC4, MC5, MC6, MC7 and MC8 are not limited thereto.

As described above, each of the memory cells MC1, MC2, MC3, MC4, MC5, MC6, MC7 and MC8 may include a corresponding gate electrode layer GEL2, GEL3, GEL4, GEL5, GEL6, GEL7, GEL8 and GEL9, the charge storage layer 116 and the channel layer 114. The program operation and the erase operation may be performed on each of the memory cells MC1, MC2, MC3, MC4, MC5, MC6, MC7 and MC8 by applying an electric field between a corresponding gate electrode layer GEL2, GEL3, GEL4, GEL5, GEL6, GEL7, GEL8 and GEL9 and the channel layer 114 such that charges may tunnel between the charge storage layer 116 and the channel layer 114. Since the channel layer 114 is electrically connected to the substrate 111, the program operation and the erase operation may be performed on each of the memory cells MC1, MC2, MC3, MC4, MC5, MC6, MC7 and MC8 by applying different voltages having different magnitudes to a corresponding gate electrode layer GEL2, GEL3, GEL4, GEL5, GEL6, GEL7, GEL8 and GEL9 and the substrate 111.

In an exemplary embodiment of the present inventive concept, the program operation may be performed on each of the memory cells MC1, MC2, MC3, MC4, MC5, MC6, MC7 and MC8 by applying a voltage to a corresponding gate electrode layer GEL2, GEL3, GEL4, GEL5, GEL6, GEL7, GEL8 and GEL9 that is higher than a voltage applied to the substrate 111 such that negative charges may tunnel from the channel layer 114 to the charge storage layer 116.

In an exemplary embodiment of the present inventive concept, the erase operation may be performed on each of the memory cells MC1, MC2, MC3, MC4, MC5, MC6, MC7 and MC8 by applying a voltage to the substrate 111 that is higher than a voltage applied to a corresponding gate electrode layer GEL2, GEL3, GEL4, GEL5, GEL6, GEL7, GEL8 and GEL9 such that negative charges may tunnel from the charge storage layer 116 to the channel layer 114.

In an exemplary embodiment of the present inventive concept, the erase operation may be performed on each of the memory cells MC1, MC2, MC3, MC4, MC5, MC6, MC7 and MC8 by applying a voltage to the substrate 111 that is higher than a voltage applied to a corresponding gate electrode layer GEL2, GEL3, GEL4, GEL5, GEL6, GEL7, GEL8 and GEL9 such that positive charges may tunnel from the channel layer 114 to the charge storage layer 116.

Each of the plurality of memory cells MC1, MC2, MC3, MC4, MC5, MC6, MC7 and MC8 may have a cylindrical shape centered on a corresponding one of the plurality of pillars PL11, PL12, PL21 and PL22.

Since each of the plurality of pillars PL11, PL12, PL21 and PL22 is formed by vertically patterning the plurality of insulation layers 112 and 112a, a width of each of the plurality of pillars PL11, PL12, PL21 and PL22 may be reduced as it gets closer to the bottom portion of the pillar.

For example, as illustrated in FIG. 6, a diameter Wb of a lower portion of the plurality of pillars PL11, PL12, PL21 and PL22 is smaller than a diameter Wt of an upper portion of the plurality of pillars PL11, PL12, PL21 and PL22 such that each of the plurality of pillars PL11, PL12, PL21 and PL22 may be a V-shaped cylinder having an inclination angle a.

Diameters of portions of the plurality of pillars PL11, PL12, PL21 and PL22 on which the plurality of memory cells MC1, MC2, MC3, MC4, MC5, MC6, MC7 and MC8 are formed may be different from each other according to their height from the substrate 111. In other words, diameters of the plurality of memory cells MC1, MC2, MC3, MC4, MC5, MC6, MC7 and MC8 may be different from each other according to their height from the substrate 111. For example, among the plurality of memory cells MC1, MC2, MC3, MC4, MC5, MC6, MC7 and MC8, a memory cell arranged at a lower portion of the plurality of pillars PL11, PL12, PL21 and PL22 may have a relatively small diameter and a memory cell arranged at an upper portion of the plurality of pillars PL11, PL12, PL21 and PL22 may have a relatively large diameter.

Referring back to FIG. 2B, the control circuit 500 may receive a command signal CMD and an address signal ADDR from the memory controller 20 and control an erase loop, a program loop and a read operation of the nonvolatile memory device 30 based on the command signal CMD and the address signal ADDR. The program loop may include a program operation and a program verification operation. The erase loop may include an erase operation and an erase verification operation.

For example, the control circuit 500 may generate control signals CTLs, which are used for controlling the voltage generator 600, based on the command signal CMD, and generate a row address R_ADDR and a column address C_ADDR based on the address signal ADDR. The control circuit 500 may provide the row address R_ADDR to the address decoder 400 and provide the column address C_ADDR to the data input/output circuit 470. The row address R_ADDR may include a block address BLK_ADDR. The control circuit 500 may provide a reset signal RST to the address decoder 400 and may provide a control signal PCB to the page buffer circuit 460.

The address decoder 400 may be coupled to the memory cell array 100 through the at least one string selection line SSL, the plurality of word-lines WLs, and the at least one ground selection line GSL. During the program operation or the read operation, the address decoder 400 may determine one of the plurality of word-lines WLs as a selected word-line and determine the rest of the plurality of word-lines WLs except for the selected word-line as unselected word-lines based on the row address R_ADDR.

The voltage generator 600 may receive power PWR from the memory controller 20 and may generate word-line voltages VWLs, which are used for the operation of the nonvolatile memory device 20, based on the control signals CTLs. The word-line voltages VWLs may be applied to the plurality of word-lines WLs through the address decoder 400.

For example, during the erase operation, the voltage generator 600 may apply an erase voltage to a well of the memory block and may apply a ground voltage to all word-lines of the memory block. During the erase verification operation, the voltage generator 600 may apply an erase verification voltage to all of the word-lines of the memory block or sequentially apply the erase verification voltage to the word-lines in a unit word-line basis.

For example, during the program operation, the voltage generator 600 may apply a program voltage to the selected word-line and may apply a program pass voltage to the unselected word-lines. In addition, during the program verification operation, the voltage generator 600 may apply a program verification voltage to the selected word-line and may apply a verification pass voltage to the unselected word-lines.

In addition, during the read operation, the voltage generator 600 may apply a read voltage to the selected word-line and may apply a read pass voltage to the unselected word-lines.

The page buffer circuit 460 may be coupled to the memory cell array 100 through the plurality of bit-lines BLs. The page buffer circuit 460 may include a plurality of page buffers. In an exemplary embodiment of the present inventive concept, one page buffer may be connected to one bit-line. In an exemplary embodiment of the present inventive concept, one page buffer may be connected to two or more bit-lines.

The page buffer circuit 460 may temporarily store data to be programmed in a selected page or data read out from the selected page.

The data input/output circuit 470 may be coupled to the page buffer circuit 460 through data lines DLs. During the program operation, the data input/output circuit 470 may receive program data DATA from the memory controller 20 and provide the program data DATA to the page buffer circuit 460 based on the column address C_ADDR received from the control circuit 500. During the read operation, the data input/output circuit 470 may provide read data DATA, which are stored in the page buffer circuit 460, to the memory controller 20 based on the column address C_ADDR received from the control circuit 500.

In addition, the page buffer circuit 460 and the data input/output circuit 470 read data from a first area of the memory cell array 100 and write the read data to a second area of the memory cell array 100. In other words, the page buffer circuit 460 and the data input/output circuit 470 may perform a copy-back operation.

Figure 10:
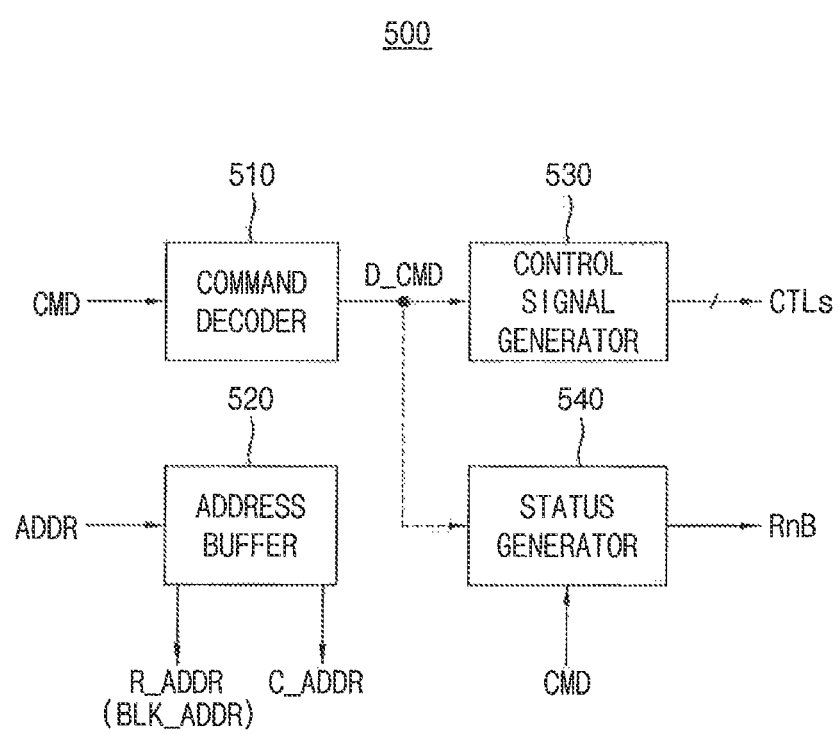
FIG. 10 is a block diagram illustrating a control circuit in the nonvolatile memory device of FIG. 2B according to an exemplary embodiment of the present inventive concept.

FIG. 10 is a block diagram illustrating the control circuit in the nonvolatile memory device of FIG. 2B according to an exemplary embodiment of the present inventive concept.

Referring to FIG. 10, the control circuit 500 includes a command decoder 510, an address buffer 520, a control signal generator 530, and a status signal generator 540.

The command decoder 510 decodes the command CMD and provides a decoded command D_CMD to the control signal generator 530. The command decoder 510 may also provide the decoded command D_CMD to the status signal generator 540.

The address buffer 520 receives the address signal ADDR, provides the row address R_ADDR to the address decoder 430 and provides the column address C_ADDR to the data input/output circuit 470.

The control signal generator 530 receives the decoded command D_CMD, generates the control signals CTLs based on an operation directed by the decoded command D_CMD and provides the control signals CTLs to the voltage generator 600.

The status signal generator 540 generates the status signal RnB indicating the operating state of the nonvolatile memory device 30 based on one of the command CMD and the decoded command D_CMD and provides the status signal RnB to the memory controller 20. The status signal generator 540 outputs the status signal RnB with a first logic level to indicate the busy state of the nonvolatile memory device 30 when the nonvolatile memory device 30 performs a memory operation such as program operation, a read operation and an erase operation. The status signal generator 540 outputs the status signal RnB with a second logic level to indicate the ready state of the nonvolatile memory device 30 when the nonvolatile memory device 30 does not perform the memory operation.

Figure 11:
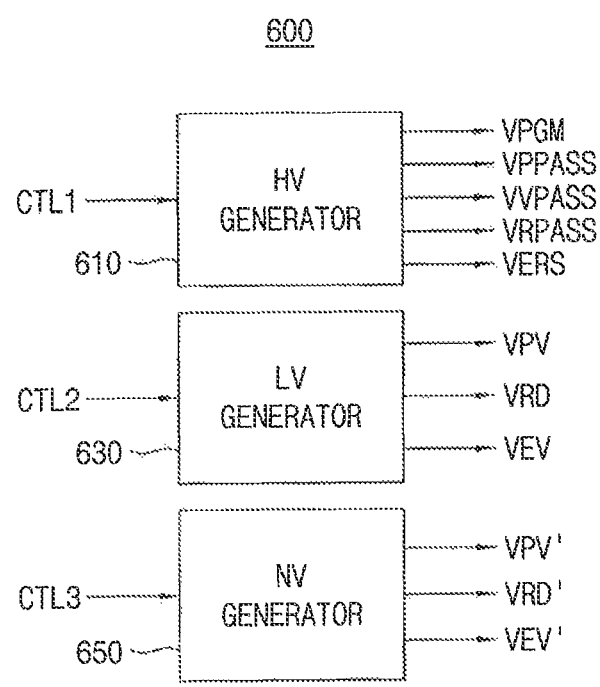
FIG. 11 is a block diagram illustrating a voltage generator in the nonvolatile memory device of FIG. 2B according to an exemplary embodiment of the present inventive concept.

FIG. 11 is a block diagram illustrating the voltage generator in the nonvolatile memory device of FIG. 2B according to an example embodiment of the present inventive concept.

Referring to FIG. 11, the voltage generator 600 includes a high voltage generator 610 and a low voltage generator 630. The voltage generator 600 may further include a negative voltage generator 650.

The high voltage generator 610 may generate a program voltage VPGM, a program pass voltage VPPASS, a verification pass voltage VVPASS, a read pass voltage VRPASS and an erase voltage VERS according to operations directed by the decoded command D_CMD, in response to a first control signal CTL1. The program voltage VPGM is applied to the selected word-line, the program pass voltage VPPASS, the verification pass voltage VVPASS, and the read pass voltage VRPASS may be applied to the unselected word-lines and the erase voltage VERS may be applied to the well of the memory block. The first control signal CTL1 may include a plurality of bits which indicate the operations directed by the decoded command D_CMD and the number of program/erase cycles indicated by a comparison signal.

The low voltage generator 630 may generate a program verification voltage VPV, a read voltage VRD and an erase verification voltage VER according to operations directed by the decoded command D_CMD, in response to a second control signal CTL2. The program verification voltage VPV, the read voltage VRD and the erase verification voltage VER may be applied to the selected word-line according to an operation of the nonvolatile memory device 30. The second control signal CTL2 may include a plurality of bits which indicate the operations directed by the decoded command D_CMD.

The negative voltage generator 650 may generate a program verification voltage VPV', a read voltage VRD' and an erase verification voltage VER' which have negative levels according to operations directed by the decoded command D_CMD, in response to a third control signal CTL3. The third control signal CTL3 may include a plurality of bits which indicate the operations directed by the decoded command D_CMD.

Figure 12A:
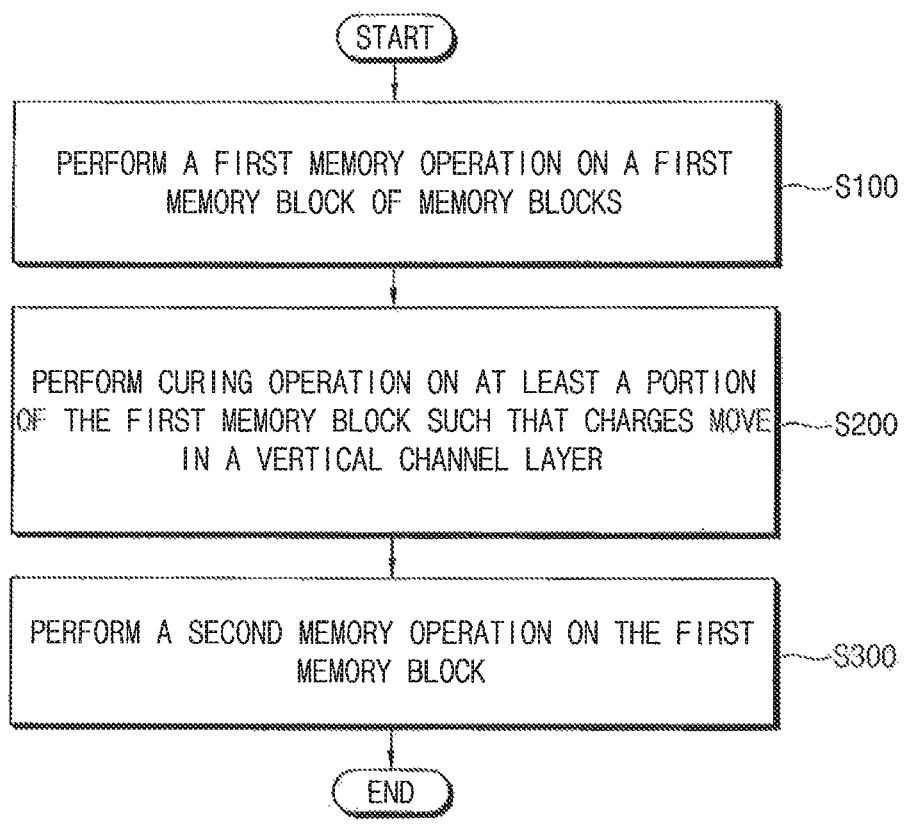
FIG. 12A is a flow chart illustrating a method of operating a nonvolatile memory device according to an exemplary embodiment of the present inventive concept.

FIG. 12A is a flow chart illustrating a method of operating a nonvolatile memory device according to an exemplary embodiment of the present inventive concept.

For example, the method of operating of FIG. 12A may be performed by the nonvolatile memory device 30 of FIG. 2B.

Referring to FIGS. 1 through 12A, in a method of operating a nonvolatile memory device 30, a first memory operation is performed on a first memory block BLKa of the memory blocks BLK1~BLKz (S100). When the first memory operation corresponds to a program operation or an erase operation, each threshold voltage of some cell transistors of the first memory block BLKa may be changed to a corresponding target state by the first memory operation. When the status signal RnB indicates a ready state of the nonvolatile memory device 30 during an interval equal to or greater than a reference interval after the first memory operation is completed, a curing operation is performed. For example, the curing operation is performed on at least some portion of the first memory block BLKa such that electrons move in a channel layer of at least one vertical string of vertical strings of the first memory block BLKa (S200). A second memory operation is performed on at least some portion of the first memory block BLKa after the curing operation is completed (S300).

The first memory operation may be performed on the at least some portion of the first memory block BLKa. The at least some portion of the first memory block BLKa may be one page of the first memory block BLKa, or one, some or all of the vertical strings CS11, CS12, CS21, CS22, CS31, CS32, CS41 and CS42 of the first memory block BLKa. In an exemplary embodiment of the present inventive concept, the first memory operation may be a program operation and the second memory operation may be a read operation. In an exemplary embodiment of the present inventive concept, the first memory operation may be a read operation and the second memory operation may be another read operation. In an exemplary embodiment of the present inventive concept, the first memory operation may be an erase operation and the second memory operation may be a read operation.

FIG. 12B is a timing diagram illustrating an operation of the memory system when the method of FIG. 12A is performed in accordance with an exemplary embodiment of the present inventive concept.

Referring to FIGS. 1, 2A, 2B, 10, 12A and 12B, the memory controller 20 transfers a command CMD, an address ADDR, and data DATA to the nonvolatile memory device 30 between timings T0 and T11 in which the status signal RnB is a ready state. The nonvolatile memory device 30 performs a first memory operation (1$^{st}$ MEM_OP) in response to the command CMD, the address ADDR, and the data DATA between timings T11 and T12. The first memory operation (1$^{st}$ MEM_OP) may be a program operation and the status signal RnB is set to a low level indicating a busy state while the first memory operation (1$^{st}$ MEM_OP) is performed.

The first memory operation (1$^{st}$ MEM_OP) is completed at the timing T12, and when the status signal RnB is set to a high level indicating a ready state, the counter 27 compares the status signal RnB set to a ready state and a reference interval. When the status signal RnB set to a ready state exceeds the reference interval at a timing T13, the memory controller 20 transmits, to the nonvolatile memory device 30, the command CMD and the address ADDR which direct the curing operation (CURING_OP). The nonvolatile memory device 30 starts the curing operation (CURING_OP) in response to the command CMD and the address ADDR which direct the curing operation (CURING_OP) at a timing T14 and completes the curing operation (CURING_OP) at a timing T15. The nonvolatile memory device 30 sets the status signal RnB to a high level at the timing T15 when the curing operation (CURING_OP) is completed.

The memory controller 20 transfers the command CMD and the address ADDR to the nonvolatile memory device 30 between timings T16 and T17 in which the status signal RnB is a ready state. The nonvolatile memory device 30 performs a second memory operation (2$^{nd}$ MEM_OP) in response to the command CMD and the address ADDR between timings T17 and T18. The second memory operation (2$^{nd}$ MEM_OP) may be a program operation and the status signal RnB is set to a high level at the timing T18 when the second memory operation (2$^{nd}$ MEM_OP) is completed.

As described above, when the ready state of the nonvolatile memory device 30 is maintained during an interval equal to or greater than the reference interval, the memory controller 20 directs the curing operation to the nonvolatile memory device 30, and the nonvolatile memory device 30 performs the curing operation in response to the direction. Therefore, credibility of the second memory operation may be increased.

Figure 14:
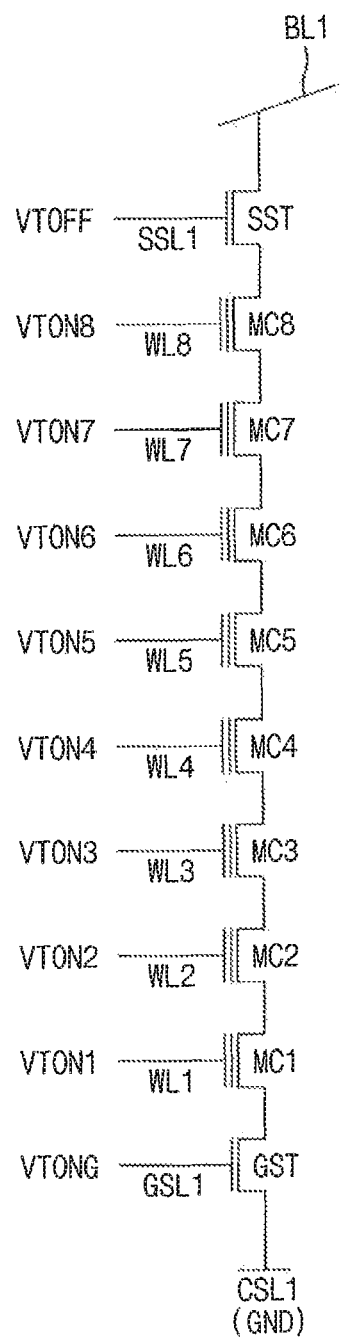
FIG. 14 illustrates a vertical string of the memory block of FIG. 8 according to an exemplary embodiment of the present inventive concept.
Figure 15:
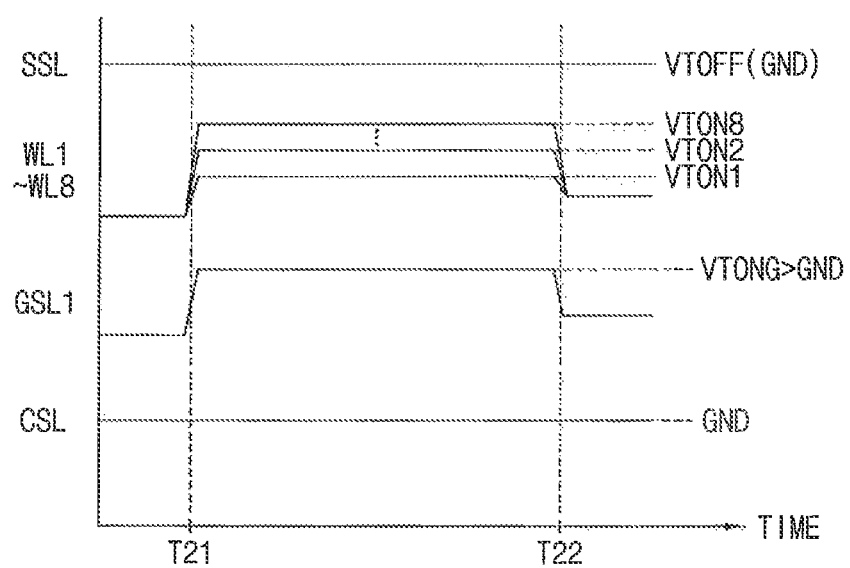
FIG. 15 illustrates voltages applied to a first vertical string in the curing operation of FIG. 13 according to an exemplary embodiment of the present inventive concept.

FIG. 13 is a flow chart illustrating a curing operation in the method of operating of FIG. 12A according to an exemplary embodiment of the present inventive concept, FIG. 14 illustrates a vertical string of the memory block of FIG. 8 according to an exemplary embodiment of the present inventive concept and FIG. 15 illustrates voltages applied to a first vertical string in the curing operation of FIG. 13 according to an exemplary embodiment of the present inventive concept.

In FIG. 14, the first vertical string CS11 of the vertical strings CS11, CS12, CS21, CS22, CS31, CS32, CS41 and CS42 in the memory block BLKa of FIG. 8 is taken for example. In addition, it is assumed that the first vertical string CS11 includes one ground selection transistor and one string selection transistor.

Referring to FIGS. 13 through 15, to perform a curing operation on at least some portion of the first memory block BLKa (S200a), a string selection transistor SST of the first vertical string CT11 is turned off by applying a turn-off voltage VTOFF to a string selection line SSL1 coupled to the string selection transistor SST of the first vertical string CT11 (S210a). The turn-off voltage VTOFF may be a ground voltage GND. Between timings T21 and T22, a plurality of turn-on voltages VTON1~VTON8 and VTONG are respectively applied to word-lines WL1~WL8 coupled to the memory cells MC1, MC2, MC3, MC4, MC5, MC6, MC7 and MC8 and a ground selection line GSL1 coupled to a ground selection transistor GST (S220a). Simultaneously, a voltage of a common source line CSL connected to the ground selection transistor GST is maintained at the ground voltage GND (230a). Each level of the turn-on voltages VTON1~VTON8 and VTONG may be higher than a corresponding level of threshold voltages of the memory cells MC1, MC2, MC3, MC4, MC5, MC6, MC7 and MC8 and the ground selection transistor GST. For example, the turn-on voltage VTON1 may be higher than the threshold voltage of the memory cell MC1, and the turn-on voltage VTONG may be higher than the threshold voltage of the ground selection transistor GST.

The turn-on voltages VTON1~VTON8 and VTONG may have a same level as one another and some or all of the turn-on voltages VTON1~VTON8 and VTONG may have different levels.

When the turn-on voltages VTON1~VTON8 and VTONG are respectively applied to the word-lines WL1~WL8 and the ground selection line GSL1, the memory cells MC1, MC2, MC3, MC4, MC5, MC6, MC7 and MC8 and the ground selection transistor GST are turned on. Since the voltage of the common source line CSL is maintained at the ground voltage GND, an electric field may be formed between the gate electrode layers GEL1, GEL2, GEL3, GEL4, GEL5, GEL6, GEL7, GEL8 and GEL9 and the channel layer 114. The electric field may move electrons (or holes), captured in traps of the channel layer 114 after the first memory operation is performed, to a surface of the channel layer 114. In this case, at least some of the threshold voltages of the memory cells MC1, MC2, MC3, MC4, MC5, MC6, MC7 and MC8 may be recovered close to target states which the memory cells MC1, MC2, MC3, MC4, MC5, MC6, MC7 and MC8 have at a time when the first memory operation is completed.

Figure 16:
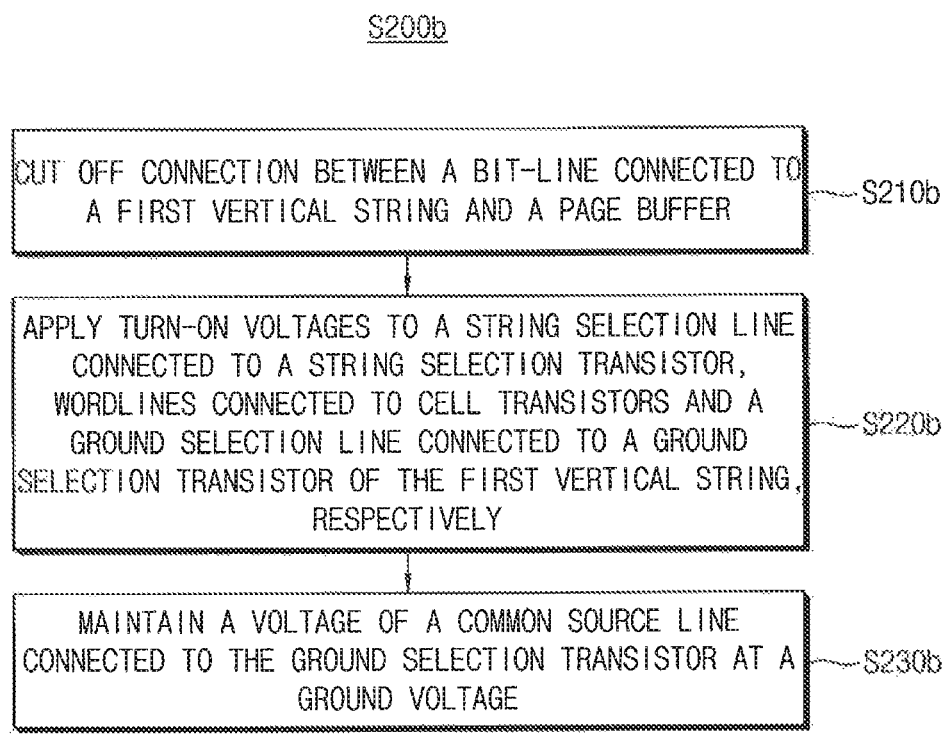
FIG. 16 is a flow chart illustrating a curing operation in the method of FIG. 12A according to an exemplary embodiment of the present inventive concept.
Figure 17:
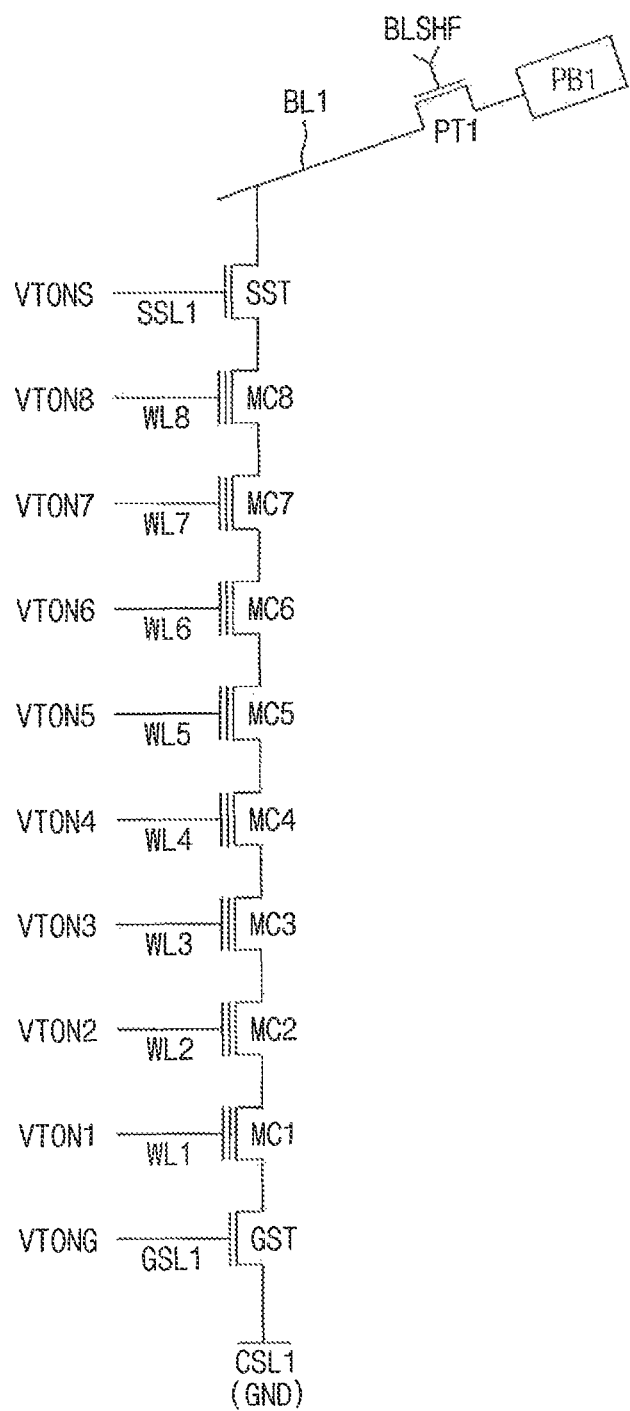
FIG. 17 illustrates a vertical string of the memory block of FIG. 8 according to an exemplary embodiment of the present inventive concept.
Figure 18:
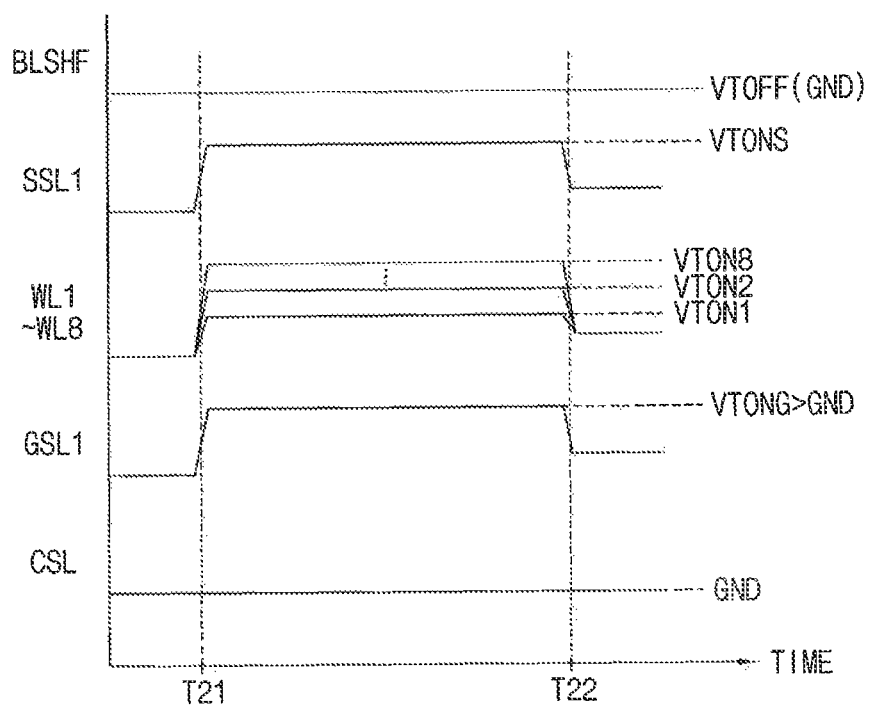
FIG. 18 illustrates voltages applied to a first vertical string in the curing operation of FIG. 16 according to an exemplary embodiment of the present inventive concept.

FIG. 16 is a flow chart illustrating a curing operation in the method of FIG. 12A according to an exemplary embodiment of the present inventive concept, FIG. 17 illustrates a vertical string of the memory block of FIG. 8 according to an exemplary embodiment of the present inventive concept and FIG. 18 illustrates voltages applied to a first vertical string in the curing operation of FIG. 16 according to an exemplary embodiment of the present inventive concept.

In FIG. 17, the first vertical string CS11 of the vertical strings CS11, CS12, CS21, CS22, CS31, CS32, CS41 and CS42 in the memory block BLKa of FIG. 8 is taken for example. In addition, it is assumed that the first vertical string CS11 includes one ground selection transistor and one string selection transistor.

Referring to FIGS. 16 through 18, to perform a curing operation on at least some portion of the first memory block BLKa (S200b), a connection between a bit-line BL1 connected to a first vertical string CT11 of the vertical strings and a page buffer PB1 is cut off by setting a control signal BLSHF to the ground voltage GND. For example, the control signal BLSHF at the ground voltage GND is applied to a transistor PT1 between timings T21 and T22 to cut the connection (S210b). The transistor PT1 connects the bit-line BL1 and the page buffer PB1. Between timings T21 and T22, a plurality of turn-on voltages VTONS, VTON1~VTON8 and VTONG are respectively applied to a string selection line SSL1 coupled to the string selection transistor SST, word-lines WL1~WL8 coupled to the memory cells MC1, MC2, MC3, MC4, MC5, MC6, MC7 and MC8 and a ground selection line GSL1 coupled to a ground selection transistor GST (S220b). Simultaneously, a voltage of a common source line CSL connected to the ground selection transistor GST is maintained at the ground voltage GND (230a). Each level of the turn-on voltages VTONS, VTON1~VTON8 and VTONG may be higher than a corresponding level of threshold voltages of the string selection transistor SST, the memory cells MC1, MC2, MC3, MC4, MC5, MC6, MC7 and MC8 and the ground selection transistor GST.

The turn-on voltages VTONS, VTON1~VTON8 and VTONG may have a same level as one another and some or all of the turn-on voltages VTONS, VTON1~VTON8 and VTONG may have different levels.

When the turn-on voltages VTONS, VTON1~VTON8 and VTONG are respectively applied to the string selection line SSL1, the word-lines WL1~WL8 and the ground selection line GSL1, the string selection transistor SST, the memory cells MC1, MC2, MC3, MC4, MC5, MC6, MC7 and MC8 and the ground selection transistor GST are turned on. Since the voltage of the common source line CSL is maintained at the ground voltage GND, an electric field may be formed between the gate electrode layers GEL1, GEL2, GEL3, GEL4, GEL5, GEL6, GEL7, GEL8, GEL9, GEL10 and the channel layer 114. The electric field may move electrons (or holes), captured in traps of the channel layer 114 after the first memory operation is performed, to a surface of the channel layer 114. In this case, at least some of the threshold voltages of the memory cells MC1, MC2, MC3, MC4, MC5, MC6, MC7 and MC8 may be recovered close to target states which the memory cells MC1, MC2, MC3, MC4, MC5, MC6, MC7 and MC8 have at a time when the first memory operation is completed.

FIGS. 19A through 19F are diagrams illustrating exemplary embodiments of the present inventive concept.

In FIGS. 19A through 19F, a portion designated by a reference numeral 140 in the cell transistor CT of FIG. 7 is taken for example. The portion 140 in FIGS. 19A through 19F, may include the fifth gate electrode layer GEL5, the charge trap layer 118 and the channel layer 114.

Figure 19A:
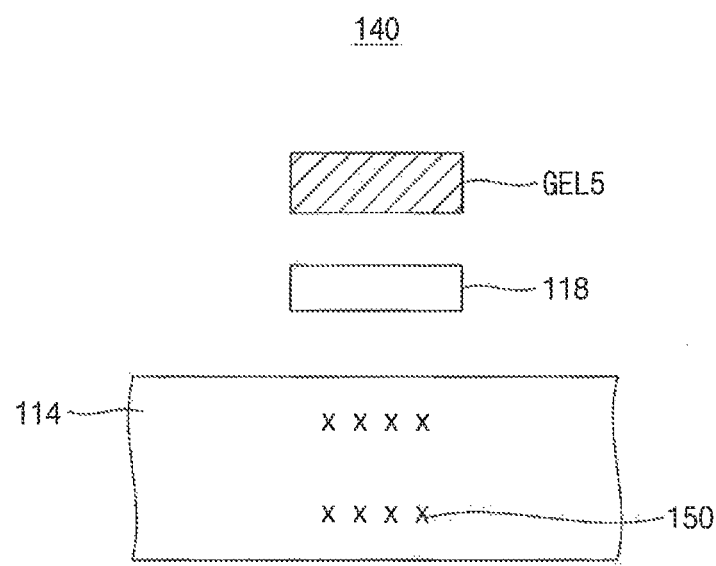
FIGS. 19A through 19F are diagrams illustrating exemplary embodiments of the present inventive concept.

FIG. 19A illustrates the portion 140 of the cell transistor CT before the first memory operation is performed.

As described above, since the channel layer 114 is formed with a poly-silicon, traps 150 may be formed in a grain boundary of the silicon crystal.

Figure 19B:
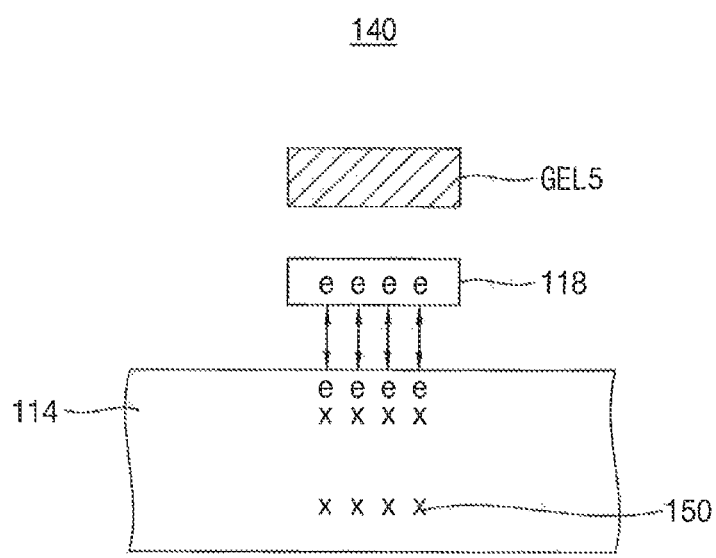

FIG. 19B illustrates the portion 140 of the cell transistor CT immediately after the first memory operation is performed.

Referring to FIG. 19B, when the first memory operation is performed on the at least some portion of the first memory block BLKa including the cell transistor CT, electrons e are captured (or trapped) in the charge trap layer 118 and in traps which are formed adjacent to a surface of the channel layer 114.

Figure 19C:
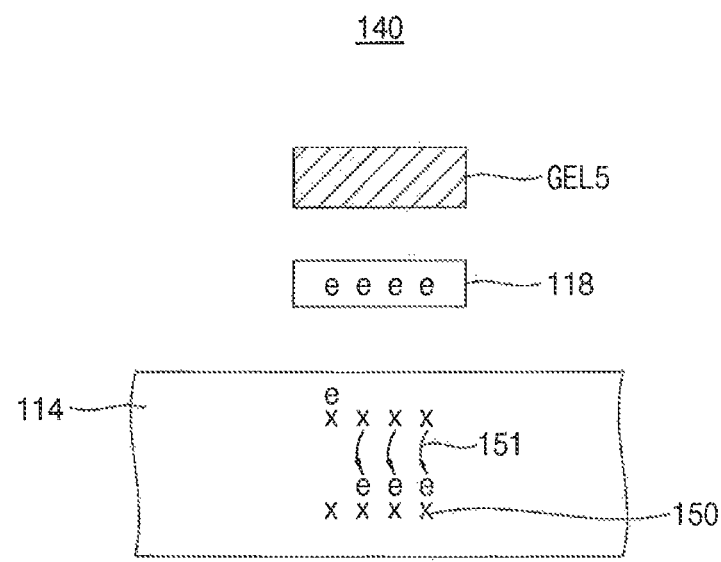

FIG. 19C illustrates the portion 140 of the cell transistor CT when a time elapses after the first memory operation is performed.

Referring to FIG. 19C, when a time elapses after the first memory operation is performed on the at least some portion of the first memory block BLKa including the cell transistor CT, electrons e captured (or trapped) in a trap (or traps) which are formed adjacent to the surface of the channel layer 114 move along an anti-direction from the surface of the channel layer 114 as represented by a reference numeral 151 and a distribution of a threshold voltage of the cell transistor CT may be changed. The anti-direction 151 may be a direction that moves away from the surface of the channel layer 114 to the traps 150.

Figure 19D:
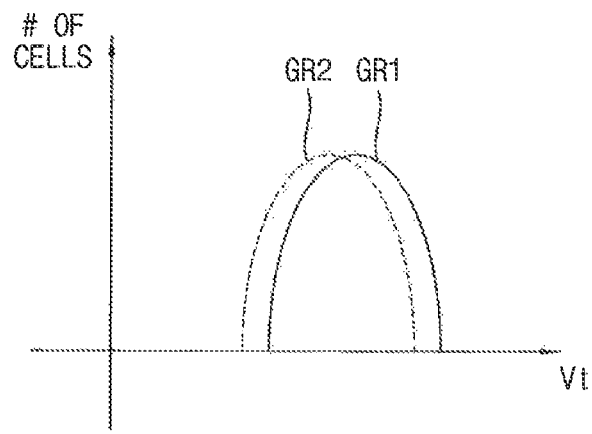

FIG. 19D illustrates distributions of the cell transistor CT immediately after the first memory operation is performed GR1 and when a time elapses after the first memory operation is performed GR2.

As is understood with reference to FIG. 19C, when the first memory operation is performed on the at least some portion of the first memory block BLKa including the cell transistor CT, the distribution of the threshold voltage Vt of the cell transistor CT moves from the graph GR1 to the graph GR2.

Figure 19E:
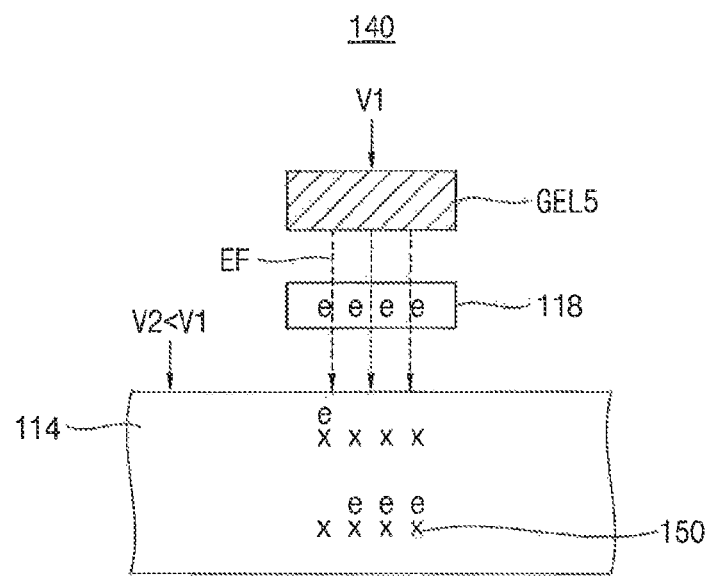
Figure 19F:
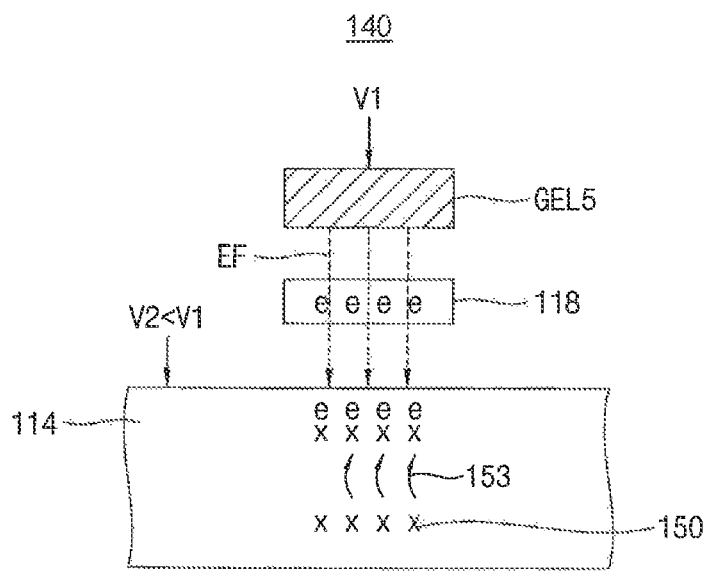

FIG. 19E illustrates voltages when the curing operation is formed on the at least some portion of the first memory block BLKa including the cell transistor CT according to an exemplary embodiment of the present inventive concept, and FIG. 19F illustrates the portion 140 of the cell transistor CT after the curing operation is performed.

Referring to FIGS. 19E and 19F, to recover a change of the threshold voltage of the cell transistor CT, a first voltage V1 is applied to the fifth gate electrode layer GEL5, and a second voltage V2 whose level is lower than the first voltage V1 is applied to the channel layer 114 through the substrate 111. In this case, an electric field EF is formed along a direction from the fifth gate electrode layer GEL5 to the channel layer 114, and electrons e captured in traps 150 move toward the surface of the channel layer 114 in response to the electric field EF as represented by a reference numeral 153. Therefore, the threshold voltage of the cell transistor CT may be recovered to a target state which the cell transistor CT has immediately after the first memory operation is completed.

The second memory operation is performed on at least some portion of the first memory block BLKa after the curing operation is performed on at least some portion of the first memory block BLKa.

In an exemplary embodiment of the present inventive concept, the first memory operation is a program operation (or a program loop) performed on the first memory block BLKa and the second memory operation is a read operation performed on the first memory block BLKa.

As described with reference to FIGS. 19A through 19F, distributions of threshold voltages of the memory cells change as time elapses after the program operation is performed. When a read operation is performed on a portion of the first memory block BLKa without performing the curing operation thereon, a number of error bits may increase due to a shift of the distribution of the threshold voltages of the memory cells when a read operation is performed. When the number of error bits exceeds an error correction capability of an error correction code (ECC), performance of the nonvolatile memory device 30 may be degraded. However, according to an exemplary embodiment of the present inventive concept, the curing operation is performed on the at least some portion of the first memory block BLKa after the first memory operation (the program operation) is performed on the first memory block BLKa and then the second memory operation (the read operation) is performed on the first memory block BLKa. The number of error bits may decrease because the read operation is performed after recovering the distributions of the memory cells close to the target states. Therefore, performance of the nonvolatile memory device 30 may be increased.

In an exemplary embodiment of the present inventive concept, the first memory operation is an erase operation (or an erase loop) performed on the first memory block BLKa and the second memory operation is a program operation performed on the first memory block BLKa after the erase operation.

When the erase operation is performed on the first memory block BLKa, holes may be captured in the tunneling insulation layer 117 in addition to the charge trap layer 118 in FIG. 7. The holes captured in the tunneling insulation layer 117 may move easily to the traps 150 in the channel layer 114 as time elapses, and thus, a distribution of the threshold voltage of the memory cell may shift.

According to an exemplary embodiment of the present inventive concept, the curing operation is performed on at least some portion of the first memory block BLKa after the erase operation is performed on the first memory block BLKa and then holes trapped in the traps 150 in the channel layer 114 may be moved back to the tunneling insulation layer 117. Therefore, the distributions of the memory cells may be recovered close to an erased state.

The curing operation may be performed simultaneously on a plurality of vertical strings included in a memory block.

Figure 20:
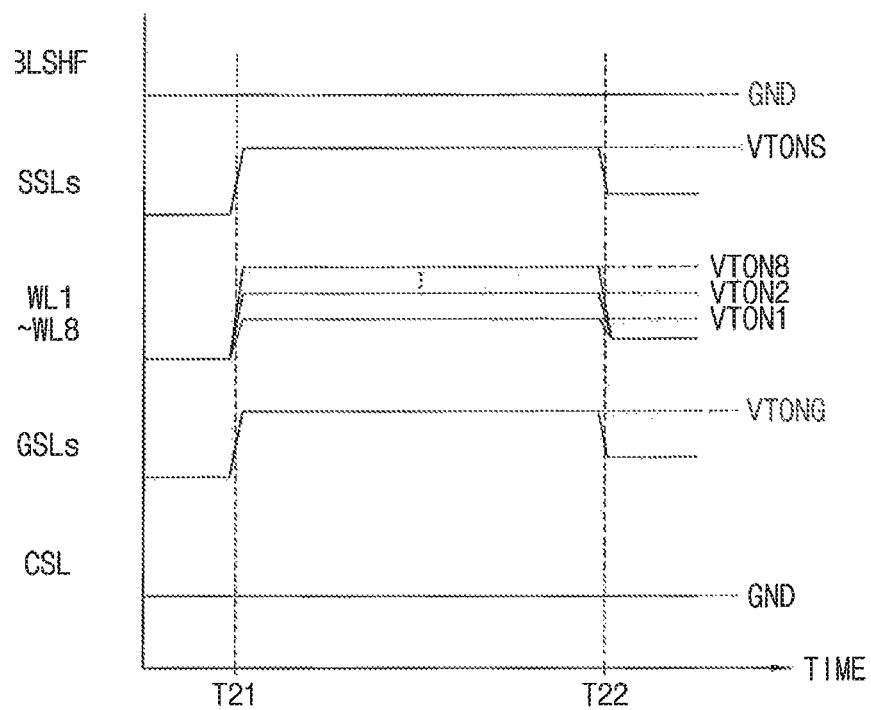
FIG. 20 illustrates a curing operation performed simultaneously on a plurality of vertical strings included in a memory block according to an exemplary embodiment of the present inventive concept.

FIG. 20 illustrates a curing operation being performed simultaneously on a plurality of vertical strings included in a memory block according to an exemplary embodiment of the present inventive concept.

In FIG. 20, the vertical strings CS11, CS12, CS21, CS22, CS31, CS32, CS41 and CS42 in the memory block BLKa of FIG. 8 are taken for example. In addition, it is assumed that each of the vertical strings CS11, CS12, CS21, CS22, CS31, CS32, CS41 and CS42 includes one ground selection transistor and one string selection transistor.

Referring to FIGS. 8 and 20, after the first memory operation is performed simultaneously or sequentially on pages of the memory block BLKa, the curing operation may be performed simultaneously on the vertical strings CS11, CS12, CS21, CS22, CS31, CS32, CS41 and CS42. Between timings T21 and T22, a plurality of turn-on voltages VTONS, VTON1~VTON8 and VTONG are respectively applied to the string selection line SSL coupled to the string selection transistor SST, the word-lines WL1~WL8 coupled to the memory cells MC1, MC2, MC3, MC4, MC5, MC6, MC7 and MC8 and the ground selection line GSL1 coupled to the ground selection transistor GST in each of the vertical strings CS11, CS12, CS21, CS22, CS31, CS32, CS41 and CS42 and a voltage of a common source line CSL connected to the ground selection transistor GST is maintained at the ground voltage GND as described with reference to FIGS. 14 and 17. Therefore, at least some of the threshold voltages of the memory cells MC1, MC2, MC3, MC4, MC5, MC6, MC7 and MC8 may be recovered close to target states in each of the vertical strings CS11, CS12, CS21, CS22, CS31, CS32, CS41 and CS42 in response to an electric field which is formed between the gate electrode layers GEL1, GEL2, GEL3, GEL4, GEL5, GEL6, GEL7, GEL8, GEL9, GEL10 and the channel layer 114 in each of the vertical strings CS11, CS12, CS21, CS22, CS31, CS32, CS41 and CS42.

In addition, current consumption may be reduced by cutting off a connection between a bit-line connected to each of the vertical strings CS11, CS12, CS21, CS22, CS31, CS32, CS41 and CS42 and a corresponding a page buffer by setting a control signal BLSHF to the ground voltage GND, which is applied to a transistor that connects the bit-line and the corresponding page buffer, between the timings T21 and T22.

The curing operation according to an exemplary embodiment of the present inventive concept may be performed simultaneously on two or more memory blocks of the memory blocks BLK1~BLKz. When the curing operation is performed simultaneously on two or more memory blocks and the memory blocks BLK1~BLKz include at least one bad memory block, the curing operation may be performed on the two or more memory blocks except the at least one bad memory block.

Figure 21:
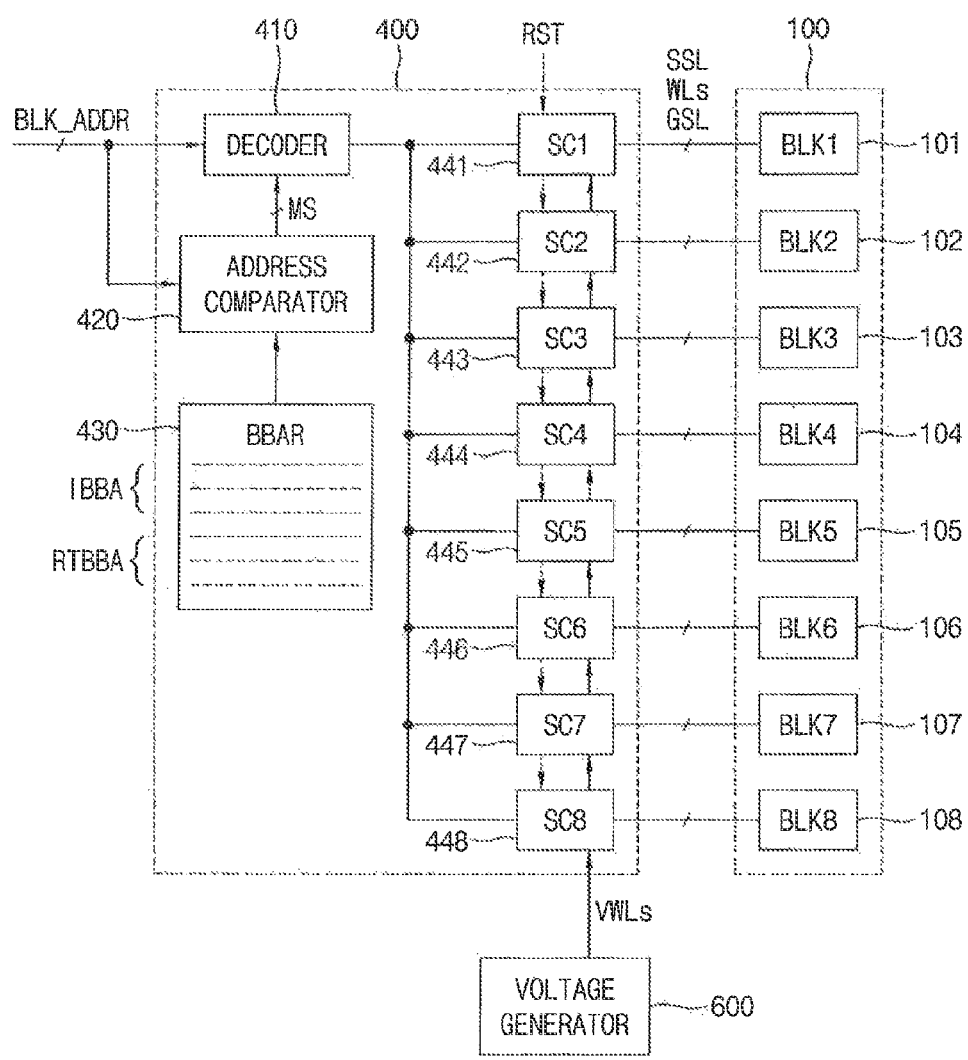
FIG. 21 is a block diagram illustrating an address decoder in the nonvolatile memory device of FIG. 2B according to an embodiment of the present inventive concept.

FIG. 21 is a block diagram illustrating the address decoder in the nonvolatile memory device of FIG. 2B according to an exemplary embodiment of the present inventive concept.

In FIG. 21, the memory cell array 100 and the voltage generator 600 are illustrated for convenience of explanation. It is assumed that the memory cell array 100 includes a plurality of memory blocks 101~108.

Referring to FIG. 21, the address decoder 400 may include a decoder 410, an address comparator 420, a bad block address register 430 and a plurality of selection circuits 441~448.

The bad block address register 430 may store a bad block address set corresponding to an address designating at least one bad block of the memory blocks 101~108. The bad block is a memory block of the memory blocks 101~108, which includes at least one page having error bits that are uncorrectable by ECC.

The bad block address set may include a first bad block address IBBA and a second bad block address RTBBA. The first bad block address IBBA may be stored in the bad block address register 430 before a power-up sequence of the nonvolatile memory device 30 and the second bad block address RTBBA may be stored in the bad block address register 430 while the nonvolatile memory device 30 is operating. The second bad block address RTBBA is a block address of a memory block which is determined to be a bad block while the nonvolatile memory device 30 is operating and may be also referred to as a run-time bad block address.

The address comparator 420 compares the block address BLK_ADDR from the control circuit 500 with the bad block address set to output a matching signal MS indicating whether the block address BLK_ADDR matches the bad block address set. The matching signal MS is output to the decoder 410.

The decoder 410 decodes the block address BLK_ADDR, generates block selection signals for selecting two or more blocks of the memory blocks 101~108 and provides the block selection signals to the selection circuits 441~448. The decoder 410 generates the block selection signals based on the matching signal MS such that at least one bad block is not selected from the memory blocks 101~108.

Each of the selection circuits 441~448 may be coupled to a corresponding one of the memory blocks 101~108 through a string selection line SSL, a plurality of word-lines WLs and a ground selection line GSL. In addition, each of the selection circuits 441~448 may selectively provide the word-line voltages VWLs from the voltage generator 600 to a corresponding one of the memory blocks 101~108 in response to the block selection signals.

Figure 22:
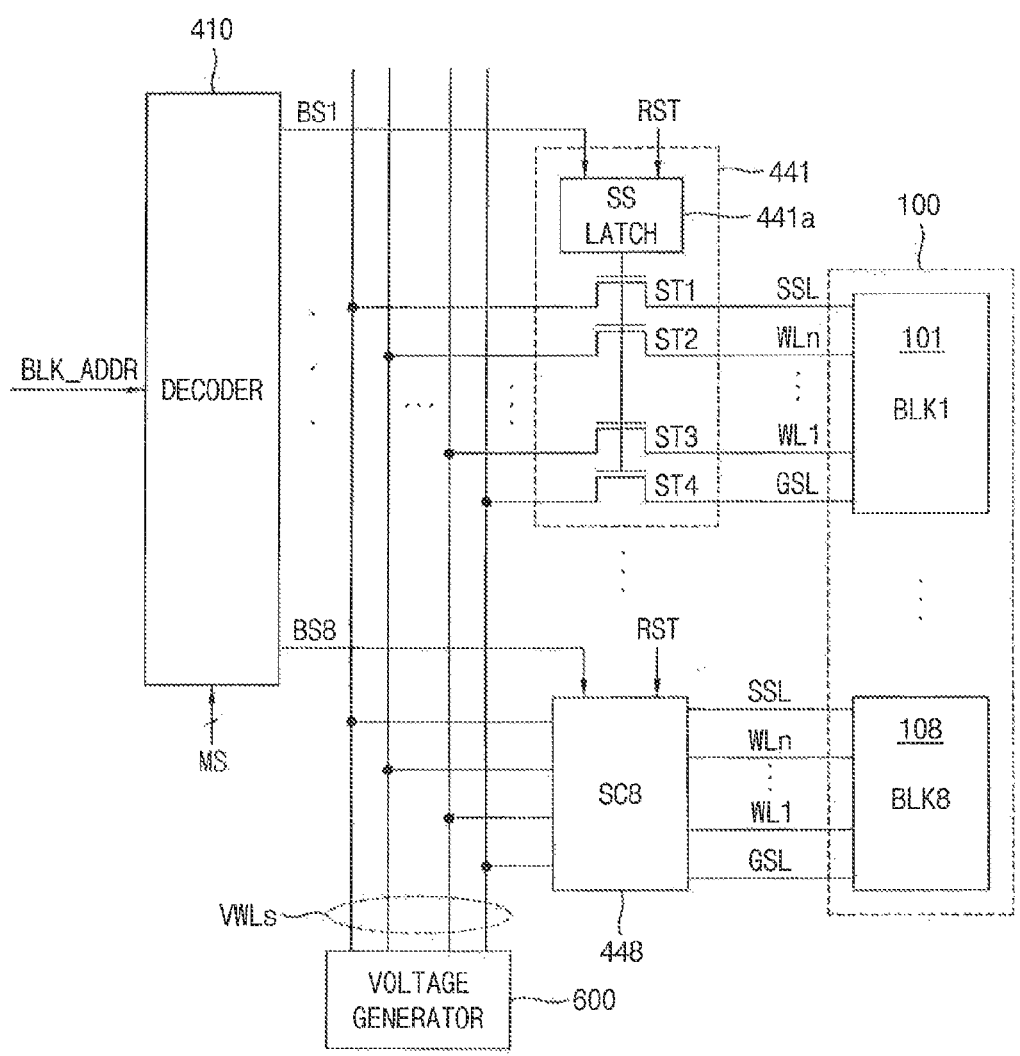
FIG. 22 illustrates the address decoder in FIG. 21 in detail in accordance with an exemplary embodiment of the present inventive concept.

FIG. 22 illustrates the address decoder in FIG. 21 in detail in accordance with an exemplary embodiment of the present inventive concept.

Although in FIG. 22, a configuration of the selection circuit 441 is illustrated in detail, each configuration of the selection circuits 442~448 may be substantially the same as the configuration of the selection circuit 441.

Referring to FIG. 22, the decoder 410 decodes the block address BLK_ADDR and the matching signal MS to provide each of the selection circuits 441~448 with a corresponding one of block selection signals BS1~BS8 for simultaneously selecting two or more memory blocks of the memory blocks 101~108. The decoder 410 generates the block selection signals BS1~BS8 such that at least one bad block is not selected from the memory blocks 101~108. Each of the selection circuits 441~448 may selectively provide the word-line voltages VWLs from the voltage generator 600 to a corresponding one of the memory blocks 101~108 in response to a corresponding one of the block selection signals BS1~BS8.

The decoder 410 may selectively activate each of the block selection signals BS1~BS8 based on the block address BLK_ADDR and the matching signal MS such that memory blocks designated by the block address BLK_ADDR are selected and the at least one bad block is not selected.

The selection circuit 441 may include a selection signal latch 441a and a plurality of selection transistors ST1~ST4. The plurality of selection transistors ST1~ST4 may be coupled to the memory block 101 through the string selection line SSL, the word-lines WLs and the ground selection line GSL. The selection signal latch 441a may latch and store the block selection signal BS1 and may provide the block selection signal BS1 to gates of the selection transistors ST1~ST4.

When the block selection signal BS1 is enabled at a first logic level, the first voltage V1 from the voltage generator 600 is provided to the memory block 101 through the selection transistors ST1~ST4 that are turned on while the curing operation is performed. The selection signal latch 441a may be reset in response to a reset signal RST provided from the control circuit 500 when the curing operation is completed.

When the block selection signal BS2 is disabled at a second logic level with the memory block 102 being a bad block, the first voltage V1 from the voltage generator 600 is not provided to the memory block 102 through the selection transistors ST1~ST4 (of the selection circuit 442) that are turned off while the curing operation is performed.

Hereinafter, there will be description on a curing operation performed simultaneously on a plurality of memory blocks with reference to FIGS. 2B, 21 and 22.

It is assumed that a read state of the nonvolatile memory device 30 is maintained during an interval equal to or greater than a reference interval after the first memory operation is completed on at least some of the memory blocks 101~108.

When the control circuit 500 receives the block address BLK_ADDR for multi-block curing from the memory controller 20, the control circuit 500 provides the block address BLK_ADDR to the decoder 410 and the address comparator 420. The address comparator 420 compares each of at least two block addresses designated by the block address BLK_ADDR with the bad block address set stored in the bad block address register 430 and provides the decoder 410 with the matching signal MS indicating whether each of at least two block addresses and the bad block address set match. The decoder 410 decodes the block address BLK_ADDR and the matching signal MS and selectively activates each of the block selection signals BS1~BS8 to provide each of the block selection signals BS1~BS8 to a corresponding one of the selection signal 441~448 such that memory blocks designated by the block address BLK_ADDR are selected and the at least one bad block is not selected.

For example, when the block address BLK_ADDR designates the memory blocks 101~103 and the memory block 102 is a bad memory block, the block selection signals BS1 and BS3 are enabled at a first logic level and the block selection signal BS2 is disabled at a second logic level. Therefore, the curing operation is performed simultaneously on the memory blocks 101 and 103. After the curing operation is completed, the control circuit 500 provides the reset signal RST to the selection signal latch 441a in each of the selection circuits 441~448 to reset the selection signal latch 441a.

Since the curing operation is performed simultaneously on two or more memory blocks, an intervening operation by the memory controller 20 may be minimized (or reduced) while performing the curing operation.

In an exemplary embodiment of the present inventive concept, each of the selection circuits 441~448 may include a bad block latch instead of the selection signal latch 441a. In this case, the bad block latch may store a first bad block address and a second bad block address like the bad block address register 430 in FIG. 21, the first bad block address may be updated internally in the nonvolatile memory device 30 and the second bad block address may be updated by the memory controller 20.

Figure 23:
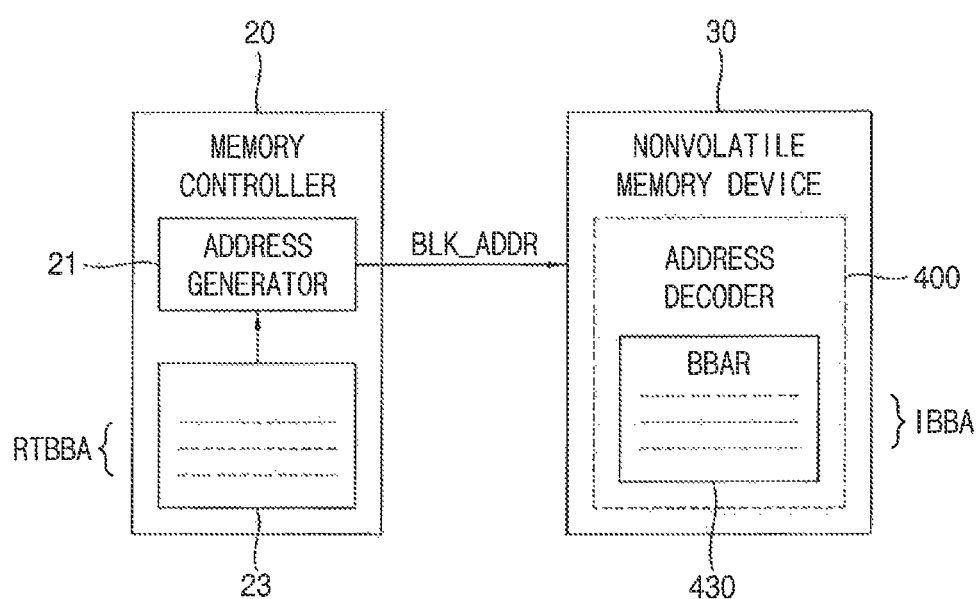
FIG. 23 illustrates a configuration of the memory system of FIG. 1 according to an exemplary embodiment of the present inventive concept.

FIG. 23 illustrates a configuration of the memory system of FIG. 1 according to an exemplary embodiment of the present inventive concept.

The memory system of FIG. 23 may be employed when the curing operation is performed on multiple blocks.

Referring to FIG. 23, the address decoder 400 in the nonvolatile memory device 30 include a first bad block address register 430 and the first bad block address register 430 may store the first bad block address IBBA. The memory controller 20 includes an address generator 21 and a second bad block address register 23 and the second bad block address register 23 may store the second bad block address RTBBA. When the address generator 21 generates the block address BLK_ADDR to perform a curing operation on at least two memory blocks, the address generator 21 generates the block address BLK_ADDR such that the second bad block address RTBBA stored in the second bad block address register 23 is not included in the block address BLK_ADDR and transmits the block address BLK_ADDR to the nonvolatile memory device 30. The nonvolatile memory device 30 compares the block address BLK_ADDR and the first bad block address IBBA and controls the curing operation such that the curing operation is not performed on a memory block designated by the first bad block address IBBA.

Figure 24:
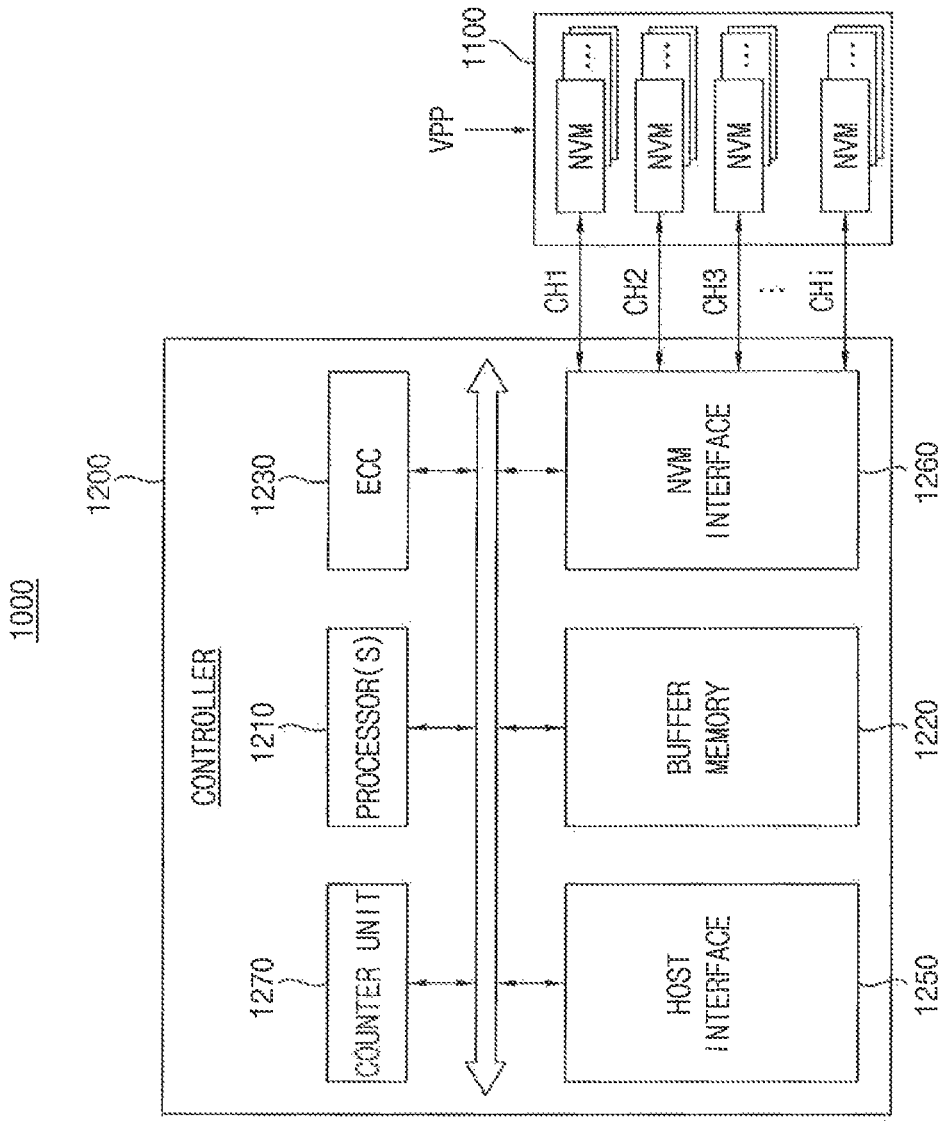
FIG. 24 is a block diagram illustrating a solid state disk or solid state drive according to an exemplary embodiment of the present inventive concept.

FIG. 24 is a block diagram illustrating a solid state disk or solid state drive (SSD) according to an exemplary embodiment of the present inventive concept.

Referring to FIG. 24, an SSD 1000 includes multiple nonvolatile memory devices 1100 and an SSD controller 1200.

The nonvolatile memory devices 1100 may be optionally supplied with an external high voltage VPP. Each of the nonvolatile memory devices 1100 may employ the nonvolatile memory device 30 of FIG. 2B. Therefore, each of the nonvolatile memory devices 1100 can perform a first memory operation on a first memory block and perform a curing operation on at least some of the first memory block when a ready state is maintained during an interval equal to or greater than a reference interval after the first memory operation is completed. Each of the nonvolatile memory devices 1100 may reduce a number of error bits to increase performance by performing a second memory operation on the first memory block after the curing operation is performed.

The SSD controller 1200 is connected to the nonvolatile memory devices 1100 through multiple channels CH1 to CHi. The SSD controller 1200 includes one or more processors 1210, a buffer memory 1220, an ECC block 1230, a host interface 1250, a nonvolatile memory interface 1260 and a counter unit 1270. The counter unit 1270 may include a plurality of counters. Each of the counters may be assigned to each of the channels CH1 to CHi or to each of the nonvolatile memory devices 1100. As described with reference to FIG. 2A, each of the counters in the counter unit 1270 receives a status signal RnB from a corresponding one of the nonvolatile memory devices 1100, compares the status signal RnB indicating the ready state with the reference interval and provides a decision signal to the processor 1210 when the ready state is maintained during an interval equal to or greater than the reference interval. The processor 1210 may generate a command and an address which direct the curing operation in response to the decision signal, provides the command and the address to a corresponding nonvolatile memory device(s) 1100 and the corresponding nonvolatile memory device(s) 1100 performs the curing operation.

The buffer memory 1220 stores data used to drive the SSD controller 1200. The buffer memory 1220 comprises multiple memory lines each storing data or a command. Although FIG. 24 illustrates that the buffer memory 1220 is included in the SSD controller 1200, the present inventive concept is not limited thereto. For example, the buffer memory 1220 may be placed outside the SSD controller 1200.

The ECC block 1230 calculates error correction code values of data to be programmed at a writing operation and corrects an error of read data using an error correction code value at a read operation. In a data recovery operation, the ECC block 1230 corrects an error of data recovered from the nonvolatile memory devices 1100. A code memory may be further included to store code data used to drive the SSD controller 1200. The code memory may be implemented by a nonvolatile memory device.

The host interface 1250 provides an interface with an external device. The nonvolatile memory interface 1260 provides an interface with the nonvolatile memory devices 1100.

Figure 25:
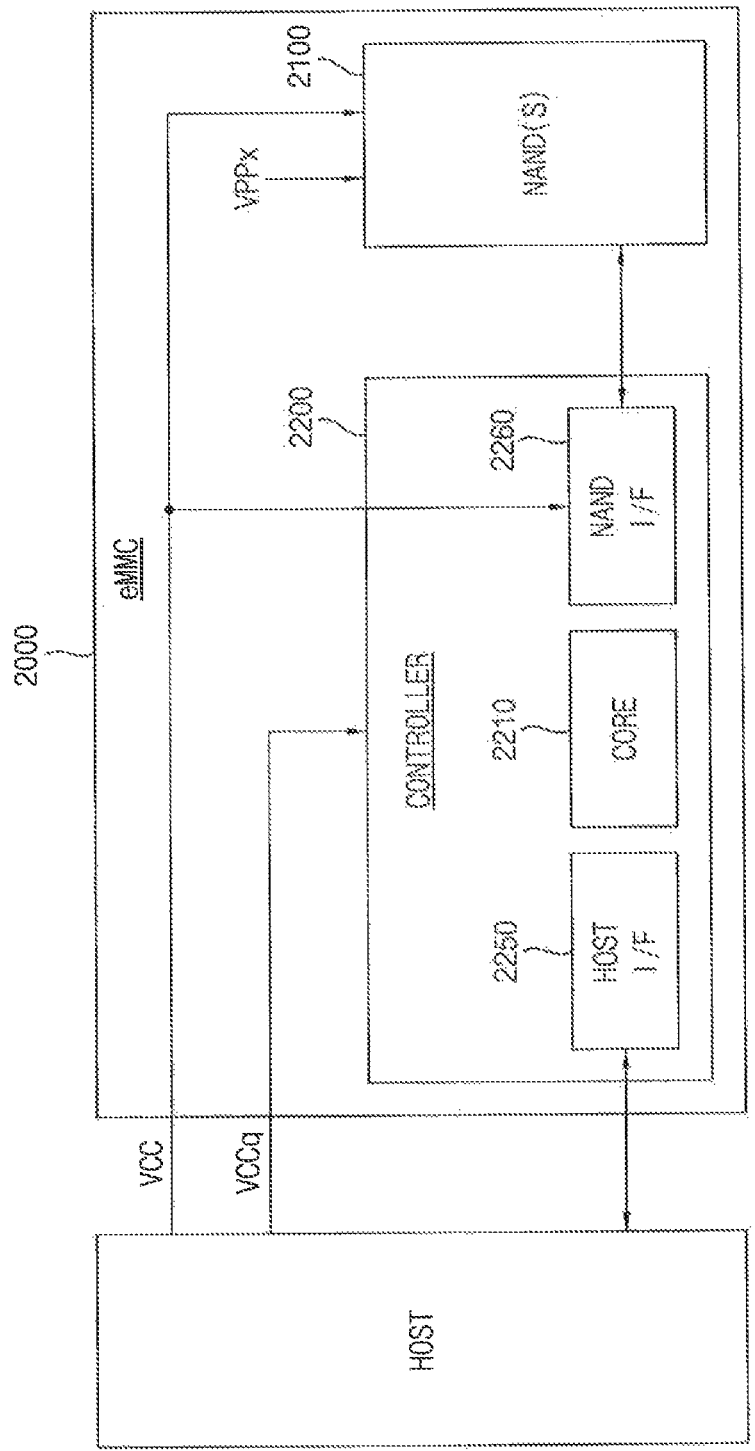
FIG. 25 is a block diagram illustrating an embedded multi-media card (eMMC) according to an exemplary embodiment of the present inventive concept.

FIG. 25 is a block diagram illustrating an embedded multi-media card (eMMC) according to an exemplary embodiment of the present inventive concept.

Referring to FIG. 25, an eMMC 2000 includes one or more NAND flash memory devices 2100 and a controller 2200.

The NAND flash memory device 2100 may employ the nonvolatile memory device 30 of FIG. 2A. Therefore, the NAND flash memory device 2100 can perform a first memory operation on a first memory block and perform a curing operation on at least some of the first memory block when a ready state is maintained during an interval equal to or greater than a reference interval after the first memory operation is completed. The NAND flash memory device 2100 may reduce a number of error bits to increase performance by performing a second memory operation on the first memory block after the curing operation is performed.

The controller 2200 is connected with the NAND flash memory device 2100 via multiple channels. The controller 2200 includes one or more controller cores 2210, a host interface 2250, and a NAND interface 2260. The controller core 2210 controls an overall operation of the eMMC 2000. The controller core 2210 includes a counter as described with reference to FIG. 2A. The host interface 2250 is configured to perform an interface between the controller 2210 and a host. The NAND interface 2260 is configured to provide an interface between the NAND flash memory device 2100 and the controller 2200. In an exemplary embodiment of the present inventive concept, the host interface 2250 may be a parallel interface (e.g., an MMC interface). In an exemplary embodiment of the present inventive concept, the host interface 2250 of eMMC 2000 may be a serial interface (e.g., ultra high speed (UHS)-II, universal flash storage (UFS), etc.).

The eMMC 2000 receives power supply voltages Vcc and Vccq from the host. For example, the power supply voltage Vcc (e.g., about 3.3V) is supplied to the NAND flash memory device 2100 and the NAND interface 2260, and the power supply voltage Vccq (e.g., about 1.8V/3.3V) is supplied to the controller 2200. In an exemplary embodiment of the present inventive concept, the eMMC 2000 may be optionally supplied with an external high voltage VPPx.

Figure 26:
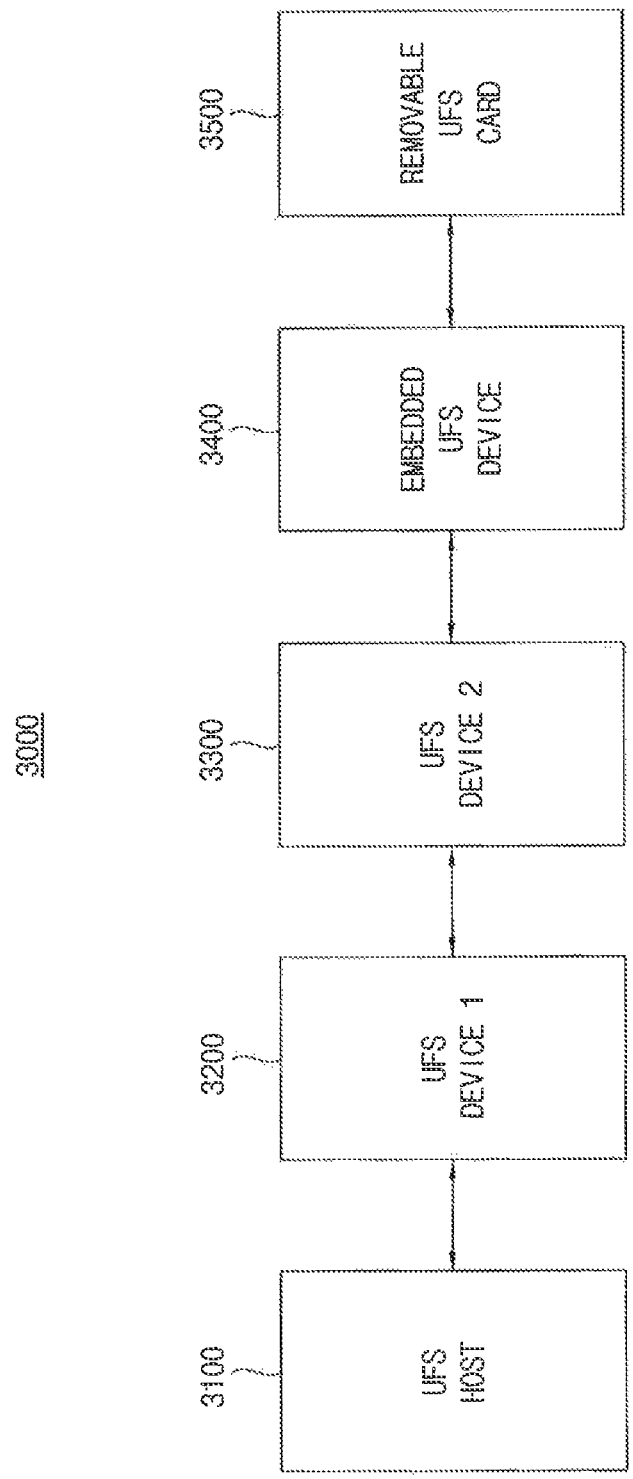
FIG. 26 is a block diagram illustrating a universal flash storage (UFS) according to an exemplary embodiment of the present inventive concept.

FIG. 26 is a block diagram illustrating a UFS according to an exemplary embodiment of the present inventive concept.

Referring to FIG. 26, a UFS system 3000 may include a UFS host 3100, UFS devices 3200 and 3300, an embedded UFS device 3400, and a removable UFS card 3500. The UFS host 3100 is an application processor of a mobile device. Each of the UFS host 3100, the UFS devices 3200 and 3300, the embedded UFS device 3400 and the removable UFS card 3500 communicate with external devices through the UFS protocol. At least one of the UFS devices 3200 and 3300, the embedded UFS device 3400, and the removable UFS card 3500 is implemented by the nonvolatile memory device 30 of FIG. 2B. Therefore, at least one of the UFS devices 3200 and 3300, the embedded UFS device 3400, and the removable UFS card 3500 can perform a first memory operation on a first memory block and perform a curing operation on at least some of the first memory block when a ready state is maintained during an interval equal to or greater than a reference interval after the first memory operation is completed. The at least one of the UFS devices 3200 and 3300, the embedded UFS device 3400, and the removable UFS card 3500 may reduce a number of error bits to increase performance by performing a second memory operation on the first memory block after the curing operation is performed.

In addition, the embedded UFS device 3400 and the removable UFS card 3500 may perform communications using protocols different from the UFS protocol. The UFS host 3100 and the removable UFS card 3500 may communicate through various card protocols (e.g., USBs, MMC, secure digital (SD), mini SD, Micro SD, etc.).

Figure 27:
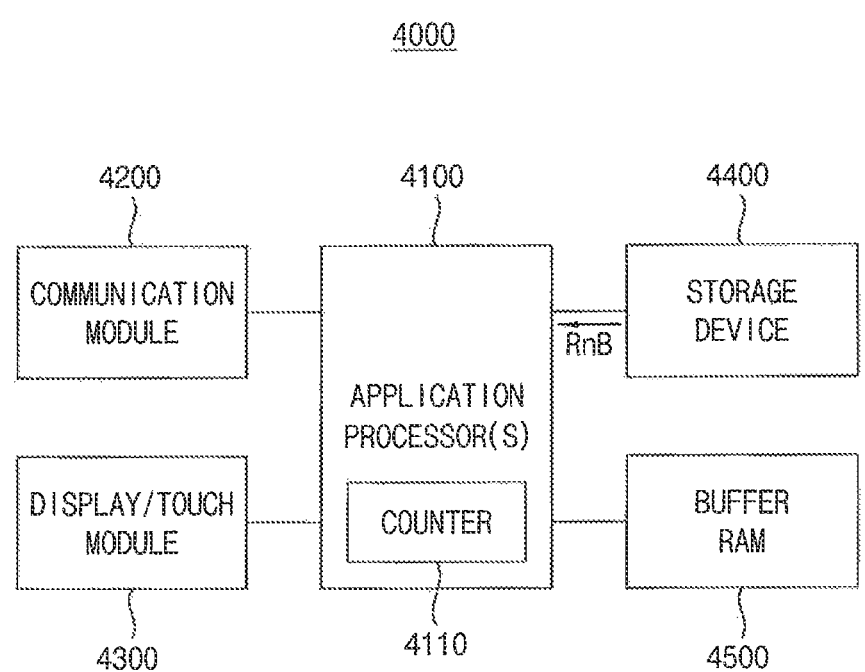
FIG. 27 is a block diagram illustrating a mobile device according to an exemplary embodiment of the present inventive concept.

FIG. 27 is a block diagram illustrating a mobile device according to an exemplary embodiment of the present inventive concept.

Referring to FIG. 27, a mobile device 4000 may include an application processor 4100, a communication module 4200, a display/touch module 4300, a storage device 4400, and a mobile random access memory (RAM) 4500.

The application processor 4100 controls operations of the mobile device 4000. The application processor 4100 includes a counter 4110. The counter 4110 may correspond to one of the counters (e.g., 27 or 1270) described above. The communication module 4200 is implemented to perform wireless or wired communications with an external device. The display/touch module 4300 is implemented to display data processed by the application processor 4100 or to receive data through a touch panel. The storage device 4400 is implemented to store user data. The storage device 4400 may be an eMMC, an SSD, a UFS device, etc. The storage device 4400 may employ the nonvolatile memory device 30 of FIG. 2B. The storage device 4400 can perform a first memory operation on a first memory block and perform a curing operation on at least some of the first memory block when a ready state is maintained during an interval equal to or greater than a reference interval after the first memory operation is completed. The storage device 4400 may reduce a number of error bits to increase performance by performing a second memory operation on the first memory block after the curing operation is performed.

The mobile RAM 4500 temporarily stores data used for processing operations of the mobile device 4000.

A memory device or a storage device according to an exemplary embodiment of the present inventive concept may be packaged using various package types or package configurations, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

The present inventive concept may be applied to various devices and systems. For example, the present inventive concept may be applied to systems such as a mobile phone, a smart phone, a personal digital assistant (PDA), a portable multimedia player (PMP), a digital camera, a camcorder, a personal computer (PC), a server computer, a workstation, a laptop computer, a digital television (TV), a set-top box, a portable game console, a navigation system, etc.

While the present inventive concept has been particularly shown and described with reference to exemplary embodiments thereof, it will be apparent to those of ordinary skill in the art that various changes in form and detail may be made therein without departing from the spirit and scope of the present inventive concept as defined by the following claims.

What is claimed is:

1. A method of operating a nonvolatile memory device, wherein the nonvolatile memory device comprises a plurality of memory blocks, each memory block including a plurality of vertical strings extending in a vertical direction with respect to a substrate, the method comprising:
performing a first memory operation on a first memory block of the memory blocks; and
performing a curing operation on a portion of the first memory block when a status signal indicates a ready state of the nonvolatile memory device during an interval equal to or greater than a reference interval after the first memory operation is completed.

2. The method of claim 1, wherein each of the vertical strings comprises:
at least one string selection transistor connected to a bit-line connected to a page buffer;
at least one ground selection transistor connected to a common source line; and
a plurality of cell transistors connected in series between the at least one string selection transistor and the at least one ground selection transistor, and
wherein a vertical channel is formed by the plurality of cell transistors.

3. The method of claim 1, wherein performing the curing operation comprises:
turning off at least one string selection transistor of a first vertical string of the vertical strings, wherein the at least one string selection transistor is turned-off by applying a ground voltage to a string selection line connected to the at least one string selection transistor;
applying a turn on voltage to each of a plurality of word-lines and a ground selection line, wherein the first vertical string includes cell transistors connected to the word-lines and at least one ground selection transistor connected to the ground selection line; and
maintaining a voltage of a common source line connected to the at least one ground selection transistor at a ground voltage.

4. The method of claim 3, wherein each turn-on voltage is greater than a threshold voltage of the cell transistor or the at least one ground selection transistor to which it is applied.

5. The method of claim 1, wherein performing the curing operation comprises:
cutting off a connection between a bit-line connected to a first vertical string of the vertical strings and a page buffer;
applying a turn-on voltage to a string selection line, each of a plurality of word-lines and a ground selection line, wherein the first vertical string includes at least one string selection transistor connected to the string selection line, cell transistors connected to the word-lines and at least one ground selection transistor connected to the ground selection line; and
maintaining a voltage of a common source line connected to the at least one ground selection transistor at a ground voltage.

6. The method of claim 5, wherein each turn-on voltage is greater than a threshold voltage of the at least one string selection transistor, the cell transistor or the at least one ground selection transistor to which it is applied.

7. The method of claim 5, wherein the curing operation is performed simultaneously on the vertical strings in the first memory block.

8. The method of claim 1, wherein the first memory operation is performed sequentially on the memory blocks including the first memory block, and
when the memory blocks include at least one bad memory block, the curing operation is performed simultaneously on other memory blocks of the memory blocks except the at least one bad memory block.

9. The method of claim 8, wherein the curing operation is performed on the other memory blocks except the at least one bad memory block based on a comparison of a block address for selecting the memory blocks and a had block address set including an address designating the at least one bad block.

10. The method of claim 9, wherein the bad block address set includes a first bad block address and a second bad block address,
the first bad block address is stored in a bad block address register of an address decoder connected to the memory blocks before a power-up sequence of the nonvolatile memory device, and
the second bad block address is stored in the bad block address register while the nonvolatile memory device is operating.

11. The method of claim 1, further comprising:
performing a second memory operation on at least some portion of the first memory block after the curing operation is completed,
wherein the first memory operation corresponds to a read operation performed on the at least some portion of the first memory block and the second memory operation corresponds to a program operation performed on the at least some portion of the first memory block.

12. A nonvolatile memory device, comprising:
a memory cell array including a plurality of memory blocks, each memory block including a plurality of vertical strings extending in a vertical direction with respect to a substrate;
a voltage generator configured to generate word-line voltages in response to a control signal;
an address decoder configured to provide the word-line voltages to the memory cell array in response to an address signal; and
a control circuit configured to control the voltage generator and the address decoder such that a first memory operation is performed on a first memory block of the memory blocks and a curing operation is performed on a portion of the first memory block in response to a command from a memory controller when a status signal indicates a ready state of the nonvolatile memory device during an interval equal to or greater than a reference interval after the first memory operation is completed.

13. The nonvolatile memory device of claim 12, wherein each of the vertical strings comprises:
at least one string selection transistor connected to a hit-line connected to a page buffer;
at least one ground selection transistor connected to a common source line; and
a plurality of cell transistors connected in series between the at least one string selection transistor and the at least one ground selection transistor, and
wherein a vertical channel is formed by the plurality of cell transistors.

14. The nonvolatile memory device of claim 12, wherein when the address decoder performs the curing operation, the address decoder is configured to:
turn off at least one string selection transistor of a first vertical string of the vertical strings, wherein the at least one string selection transistor is turned-off by applying a ground voltage to a string selection line connected to the at least one string selection transistor;
apply turn-on voltages to each of a plurality of word-lines and a ground selection line, wherein the first vertical string includes cell transistors connected to the word-lines and at least one ground selection transistor connected to the ground selection line; and
maintain a voltage of a common source line connected to the at least one ground selection transistor at a ground voltage, and
wherein each turn-on voltage is greater than a threshold voltage of the cell transistor or the at least one ground selection transistor to which it is applied.

15. The nonvolatile memory device of claim 12, wherein when the address decoder performs the curing operation, the address decoder is configured to:
cut off a connection between a bit-line connected to a first vertical string of the vertical strings and a page buffer;
apply a turn-on voltage to a string selection line, each of a plurality of word-lines and a ground selection line, wherein the first vertical string includes at least one string selection transistor connected to the string selection line, cell transistors connected to the word-lines and at least one ground selection transistor connected to the ground selection line; and
maintain a voltage of a common source line connected to the at least one ground selection transistor at a ground voltage, and
wherein each turn-on voltage is greater than a threshold voltage of the at least one string selection transistor, the cell transistor or the at least one ground selection transistor to which it is applied.

16. The nonvolatile memory device of claim 12, wherein the address decoder comprises:
a bad block address register that stores an address designating at least one bad memory block of the memory blocks;
an address comparator configured to compare a block address for selecting two or more memory blocks of the memory blocks with a bad block address set stored in the bad block address register and to output a matching signal indicating whether the block address matches the bad block address set;
a decoder configured to decode the match signal and the block address and to provide a plurality of block selection signals; and
a plurality of selection circuits, connected to the memory blocks, and configured to selectively provide turn-on voltages from the voltage generator to the memory blocks in response to the block selection signals, when the curing operation is performed.

17. The nonvolatile memory device of claim 16, wherein the bad block address set includes a first bad block address and a second bad block address,
the first bad block address is stored in the bad block address register before a power-up sequence of the nonvolatile memory device, and
the second bad block address is stored in the bad block address register while the nonvolatile memory device is operating.

18. A nonvolatile memory device, comprising:
a memory cell array including a plurality of memory blocks, wherein a first memory block of the memory blocks includes a plurality of strings, and wherein a first string of the plurality of strings includes a plurality of transistors stacked in a direction substantially perpendicular to a substrate; and
a control circuit configured to instruct a curing operation to be performed on the first memory block, wherein the curing operation is performed after the nonvolatile memory device has been in a ready state for a predetermined time after a first memory operation performed on the first memory block ends, wherein a status signal indicated the ready state, and after the status signal has been in the ready state for more than the predetermined time, the control circuit is provided with a command and an address of the first memory block, and the curing operation is performed on a region of the first memory block designated by the address.

19. The nonvolatile memory device of claim 18, wherein after the curing operation is performed; electrons of a channel layer of the first string that were moved away from a surface of the channel layer by the first memory operation move back to the surface of the channel layer.

* * * * *